(12) United States Patent
Co et al.

(10) Patent No.: US 9,888,579 B2
(45) Date of Patent: Feb. 6, 2018

(54) PRESSING OF WIRE BOND WIRE TIPS TO PROVIDE BENT-OVER TIPS

(71) Applicant: Invensas Corporation, San Jose, CA (US)

(72) Inventors: Reynaldo Co, Santa Cruz, CA (US); Grant Villavicencio, San Jose, CA (US); Wael Zohni, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/639,789

(22) Filed: Mar. 5, 2015

(65) Prior Publication Data

US 2016/0262268 A1    Sep. 8, 2016

(51) Int. Cl.
*H05K 3/10* (2006.01)
*H05K 1/02* (2006.01)
(Continued)

(52) U.S. Cl.
CPC ....... *H05K 3/103* (2013.01); *B29C 45/14065* (2013.01); *B29C 45/14655* (2013.01);
(Continued)

(58) Field of Classification Search
CPC ...... H05K 3/284; H05K 3/103; H05K 3/0014; H05K 1/0296; Y10T 29/49146;
(Continued)

(56) References Cited

U.S. PATENT DOCUMENTS 2,230,663 A * 2/1941 Alden ............... H02B 3/00
29/33.52
3,289,452 A   12/1966 Koellner
(Continued)

FOREIGN PATENT DOCUMENTS

CN    1352804 A    6/2002
CN    1641832 A    7/2005
(Continued)

OTHER PUBLICATIONS

"3DPlus Wafer Level Stack," EE Times Asia [online]. [Retrieved Aug. 5, 2010]. Retrieved from internet. <http://www.eetasia.com/ART_8800428222_480300_nt_dec52276.HTM>, 4 pages.
(Continued)

*Primary Examiner* — Peter DungBa Vo
*Assistant Examiner* — Kaying Kue

(57) ABSTRACT

In a method for forming a microelectronic device, a substrate is loaded into a mold press. The substrate has a first surface and a second surface. The second surface is placed on an interior lower surface of the mold press. The substrate has a plurality of wire bond wires extending from the first surface toward an interior upper surface of the mold press. An upper surface of a mold film is indexed to the interior upper surface of the mold press. A lower surface of the mold film is punctured with tips of the plurality of wire bond wires for having the tips of the plurality of wire bond wires extending above the lower surface of the mold film into the mold film. The tips of the plurality of wire bond wires are pressed down toward the lower surface of the mold film to bend the tips over.

9 Claims, 8 Drawing Sheets

(51) Int. Cl.
  *H05K 3/00* (2006.01)
  *B29C 45/14* (2006.01)
  *B29L 31/34* (2006.01)
(52) U.S. Cl.
  CPC ..... *B29C 45/14754* (2013.01); *H05K 1/0296* (2013.01); *H05K 3/0014* (2013.01); *B29C 45/14221* (2013.01); *B29C 2045/1477* (2013.01); *B29L 2031/3425* (2013.01); *H01L 2224/16225* (2013.01); *H01L 2224/48091* (2013.01); *H01L 2924/15311* (2013.01); *H01L 2924/181* (2013.01); *H01L 2924/19107* (2013.01); *H05K 2201/10757* (2013.01); *H05K 2201/10818* (2013.01)
(58) Field of Classification Search
  CPC ............... H01L 23/3157; H01L 23/28; H01L 2924/181; H01L 2924/16225; H01L 2924/48091; H01L 2924/15311
  USPC .... 29/841, 885, 882, 884, 87; 438/124, 127, 438/125
  See application file for complete search history.

(56) References Cited

U.S. PATENT DOCUMENTS

| | | | |
|---|---|---|---|
| 3,358,897 | A | 12/1967 | Christensen |
| 3,430,835 | A | 3/1969 | Grable et al. |
| 3,623,649 | A | 11/1971 | Keisling |
| 3,795,037 | A | 3/1974 | Luttmer |
| 3,900,153 | A | 8/1975 | Beerwerth et al. |
| 4,067,104 | A | 1/1978 | Tracy |
| 4,072,816 | A | 2/1978 | Gedney et al. |
| 4,213,556 | A | 7/1980 | Persson et al. |
| 4,327,860 | A | 5/1982 | Kirshenboin et al. |
| 4,422,568 | A | 12/1983 | Elles et al. |
| 4,437,604 | A | 3/1984 | Razon et al. |
| 4,604,644 | A | 8/1986 | Beckham et al. |
| 4,642,889 | A | 2/1987 | Grabbe |
| 4,667,267 | A | 5/1987 | Hernandez et al. |
| 4,695,870 | A | 9/1987 | Patraw |
| 4,716,049 | A | 12/1987 | Patraw |
| 4,725,692 | A | 2/1988 | Ishii et al. |
| 4,771,930 | A | 9/1988 | Gillotti et al. |
| 4,793,814 | A * | 12/1988 | Zifcak ................ H01R 13/2435 439/66 |
| 4,804,132 | A | 2/1989 | DiFrancesco |
| 4,845,354 | A | 7/1989 | Gupta et al. |
| 4,902,600 | A | 2/1990 | Tamagawa et al. |
| 4,924,353 | A | 5/1990 | Patraw |
| 4,925,083 | A | 5/1990 | Farassat et al. |
| 4,955,523 | A | 9/1990 | Carlommagno et al. |
| 4,975,079 | A | 12/1990 | Beaman et al. |
| 4,982,265 | A | 1/1991 | Watanabe et al. |
| 4,998,885 | A | 3/1991 | Beaman |
| 4,999,472 | A | 3/1991 | Neinast et al. |
| 5,067,007 | A | 11/1991 | Otsuka et al. |
| 5,067,382 | A | 11/1991 | Zimmerman et al. |
| 5,083,697 | A | 1/1992 | DiFrancesco |
| 5,095,187 | A | 3/1992 | Gliga |
| 5,133,495 | A | 7/1992 | Angulas et al. |
| 5,138,438 | A | 8/1992 | Masayuki et al. |
| 5,148,265 | A | 9/1992 | Khandros et al. |
| 5,148,266 | A | 9/1992 | Khandros et al. |
| 5,186,381 | A | 2/1993 | Kim |
| 5,189,505 | A | 2/1993 | Bartelink |
| 5,196,726 | A | 3/1993 | Nishiguchi et al. |
| 5,203,075 | A | 4/1993 | Angulas et al. |
| 5,214,308 | A | 5/1993 | Nishiguchi et al. |
| 5,220,489 | A | 6/1993 | Barreto et al. |
| 5,222,014 | A | 6/1993 | Lin |
| 5,238,173 | A | 8/1993 | Ura et al. |
| 5,241,456 | A | 8/1993 | Marcinkiewicz et al. |
| 5,316,788 | A | 5/1994 | Dibble et al. |
| 5,340,771 | A | 8/1994 | Rostoker |
| 5,346,118 | A | 9/1994 | Degani et al. |
| 5,371,654 | A | 12/1994 | Beaman et al. |
| 5,397,997 | A | 3/1995 | Tuckerman et al. |
| 5,438,224 | A | 8/1995 | Papageorge et al. |
| 5,455,390 | A * | 10/1995 | DiStefano ............. H01L 21/486 174/251 |
| 5,468,995 | A | 11/1995 | Higgins, III |
| 5,494,667 | A | 2/1996 | Uchida et al. |
| 5,495,667 | A | 3/1996 | Farnworth et al. |
| 5,518,964 | A | 5/1996 | DiStefano et al. |
| 5,525,545 | A * | 6/1996 | Grube .................... H01L 24/72 257/E23.078 |
| 5,531,022 | A | 7/1996 | Beaman et al. |
| 5,536,909 | A | 7/1996 | DiStefano et al. |
| 5,541,567 | A | 7/1996 | Fogel et al. |
| 5,571,428 | A | 11/1996 | Nishimura et al. |
| 5,578,869 | A | 11/1996 | Hoffman et al. |
| 5,608,265 | A | 3/1997 | Kitano et al. |
| 5,615,824 | A | 4/1997 | Fjelstad et al. |
| 5,635,846 | A | 6/1997 | Beaman et al. |
| 5,656,550 | A | 8/1997 | Tsuji et al. |
| 5,659,952 | A | 8/1997 | Kovac et al. |
| 5,679,977 | A | 10/1997 | Khandros et al. |
| 5,688,716 | A | 11/1997 | DiStefano et al. |
| 5,718,361 | A | 2/1998 | Braun et al. |
| 5,726,493 | A | 3/1998 | Yamashita et al. |
| 5,731,709 | A | 3/1998 | Pastore et al. |
| 5,736,780 | A | 4/1998 | Murayama |
| 5,736,785 | A | 4/1998 | Chiang et al. |
| 5,766,987 | A | 6/1998 | Mitchell et al. |
| 5,787,581 | A | 8/1998 | DiStefano et al. |
| 5,801,441 | A | 9/1998 | DiStefano et al. |
| 5,802,699 | A | 9/1998 | Fjelstad et al. |
| 5,811,982 | A | 9/1998 | Beaman et al. |
| 5,821,763 | A | 10/1998 | Beaman et al. |
| 5,830,389 | A | 11/1998 | Capote et al. |
| 5,831,836 | A | 11/1998 | Long et al. |
| 5,839,191 | A | 11/1998 | Economy et al. |
| 5,854,507 | A | 12/1998 | Miremadi et al. |
| 5,874,781 | A | 2/1999 | Fogal et al. |
| 5,898,991 | A | 5/1999 | Fogel et al. |
| 5,908,317 | A | 6/1999 | Heo |
| 5,912,505 | A | 6/1999 | Itoh et al. |
| 5,948,533 | A | 9/1999 | Gallagher et al. |
| 5,953,624 | A | 9/1999 | Bando et al. |
| 5,971,253 | A | 10/1999 | Gilleo et al. |
| 5,973,391 | A | 10/1999 | Bischoff et al. |
| 5,977,618 | A | 11/1999 | DiStefano et al. |
| 5,980,270 | A | 11/1999 | Fjelstad et al. |
| 5,989,936 | A | 11/1999 | Smith et al. |
| 5,994,152 | A | 11/1999 | Khandros et al. |
| 6,000,126 | A | 12/1999 | Pai |
| 6,002,168 | A | 12/1999 | Bellaar et al. |
| 6,032,359 | A | 3/2000 | Carroll |
| 6,038,136 | A | 3/2000 | Weber |
| 6,052,287 | A | 4/2000 | Palmer et al. |
| 6,054,337 | A | 4/2000 | Solberg |
| 6,054,756 | A | 4/2000 | DiStefano et al. |
| 6,077,380 | A | 6/2000 | Hayes et al. |
| 6,117,694 | A | 9/2000 | Smith et al. |
| 6,121,676 | A | 9/2000 | Solberg |
| 6,124,546 | A | 9/2000 | Hayward et al. |
| 6,133,072 | A | 10/2000 | Fjelstad |
| 6,145,733 | A | 11/2000 | Streckfuss et al. |
| 6,157,080 | A | 12/2000 | Tamaki et al. |
| 6,158,647 | A | 12/2000 | Chapman et al. |
| 6,164,523 | A | 12/2000 | Fauty et al. |
| 6,168,965 | B1 | 1/2001 | Malinovich et al. |
| 6,177,636 | B1 | 1/2001 | Fjelstad |
| 6,180,881 | B1 | 1/2001 | Isaak |
| 6,194,250 | B1 | 2/2001 | Melton et al. |
| 6,194,291 | B1 | 2/2001 | DiStefano et al. |
| 6,202,297 | B1 | 3/2001 | Farad et al. |
| 6,206,273 | B1 | 3/2001 | Beaman et al. |
| 6,208,024 | B1 * | 3/2001 | DiStefano ......... H01L 23/49838 257/692 |
| 6,211,572 | B1 | 4/2001 | Fjelstad et al. |
| 6,211,574 | B1 | 4/2001 | Tao et al. |

(56) References Cited

U.S. PATENT DOCUMENTS

| | | | |
|---|---|---|---|
| 6,215,670 B1 | 4/2001 | Khandros |
| 6,218,728 B1 | 4/2001 | Kimura |
| 6,225,688 B1 | 5/2001 | Kim et al. |
| 6,238,949 B1 | 5/2001 | Nguyen et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,268,662 B1 | 7/2001 | Test et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,329,224 B1 | 12/2001 | Nguyen et al. |
| 6,332,270 B2* | 12/2001 | Beaman ............ G01R 1/07378 29/844 |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,376,769 B1 | 4/2002 | Chung |
| 6,388,333 B1 | 5/2002 | Taniguchi et al. |
| 6,395,199 B1 | 5/2002 | Krassowski et al. |
| 6,399,426 B1 | 6/2002 | Capote et al. |
| 6,407,448 B2 | 6/2002 | Chun |
| 6,407,456 B1 | 6/2002 | Ball |
| 6,410,431 B2 | 6/2002 | Bertin et al. |
| 6,413,850 B1 | 7/2002 | Ooroku et al. |
| 6,439,450 B1 | 8/2002 | Chapman et al. |
| 6,458,411 B1 | 10/2002 | Goossen et al. |
| 6,469,260 B2 | 10/2002 | Horiuchi et al. |
| 6,469,373 B2 | 10/2002 | Funakura et al. |
| 6,476,503 B1 | 11/2002 | Imamura et al. |
| 6,476,506 B1 | 11/2002 | O'Connor |
| 6,476,583 B2 | 11/2002 | McAndrews |
| 6,486,545 B1 | 11/2002 | Glenn et al. |
| 6,489,182 B2 | 12/2002 | Kwon |
| 6,489,676 B2 | 12/2002 | Taniguchi et al. |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2* | 4/2003 | Chew ................ H01L 23/4951 228/180.22 |
| 6,555,918 B2* | 4/2003 | Masuda ............ H01L 23/4951 257/692 |
| 6,560,117 B2 | 5/2003 | Moon |
| 6,563,205 B1 | 5/2003 | Fogal et al. |
| 6,563,217 B2 | 5/2003 | Corisis et al. |
| 6,573,458 B1 | 6/2003 | Matsubara et al. |
| 6,578,754 B1 | 6/2003 | Tung |
| 6,581,276 B2 | 6/2003 | Chung |
| 6,581,283 B2 | 6/2003 | Sugiura et al. |
| 6,624,653 B1 | 9/2003 | Cram |
| 6,630,730 B2 | 10/2003 | Grigg |
| 6,639,303 B2 | 10/2003 | Siniaguine |
| 6,647,310 B1 | 11/2003 | Yi et al. |
| 6,650,013 B2 | 11/2003 | Yin et al. |
| 6,653,170 B1 | 11/2003 | Lin |
| 6,684,007 B2 | 1/2004 | Yoshimura et al. |
| 6,686,268 B2* | 2/2004 | Farnworth ............ H01L 21/563 257/E21.503 |
| 6,687,988 B1 | 2/2004 | Sugiura et al. |
| 6,693,363 B2 | 2/2004 | Tay et al. |
| 6,696,305 B2 | 2/2004 | Kung et al. |
| 6,699,730 B2 | 3/2004 | Kim et al. |
| 6,708,403 B2 | 3/2004 | Beaman et al. |
| 6,720,783 B2* | 4/2004 | Satoh ................ G01R 1/0433 324/754.08 |
| 6,730,544 B1 | 5/2004 | Yang |
| 6,733,711 B2 | 5/2004 | Durocher et al. |
| 6,734,539 B2 | 5/2004 | Degani et al. |
| 6,734,542 B2 | 5/2004 | Nakatani et al. |
| 6,740,980 B2 | 5/2004 | Hirose |
| 6,740,981 B2 | 5/2004 | Hosomi |
| 6,746,894 B2 | 6/2004 | Fee et al. |
| 6,754,407 B2 | 6/2004 | Chakravorty et al. |
| 6,756,252 B2 | 6/2004 | Nakanishi |
| 6,756,663 B2 | 6/2004 | Shiraishi et al. |
| 6,759,738 B1 | 7/2004 | Fallon et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,777,797 B2 | 8/2004 | Egawa |
| 6,778,406 B2 | 8/2004 | Eldridge et al. |
| 6,787,926 B2 | 9/2004 | Chen et al. |
| 6,790,757 B1 | 9/2004 | Chillipeddi et al. |
| 6,800,941 B2 | 10/2004 | Lee et al. |
| 6,812,575 B2 | 11/2004 | Furusawa |
| 6,815,257 B2 | 11/2004 | Yoon et al. |
| 6,825,552 B2 | 11/2004 | Light et al. |
| 6,828,665 B2 | 12/2004 | Pu et al. |
| 6,828,668 B2 | 12/2004 | Smith et al. |
| 6,844,619 B2 | 1/2005 | Tago |
| 6,856,235 B2 | 2/2005 | Fjelstad |
| 6,864,166 B1 | 3/2005 | Yin et al. |
| 6,867,499 B1 | 3/2005 | Tabrizi |
| 6,874,910 B2 | 4/2005 | Sugimoto et al. |
| 6,897,565 B2 | 5/2005 | Pflughaupt et al. |
| 6,900,530 B1 | 5/2005 | Tsai |
| 6,902,869 B2 | 6/2005 | Appelt et al. |
| 6,902,950 B2 | 6/2005 | Ma et al. |
| 6,906,408 B2 | 6/2005 | Cloud et al. |
| 6,909,181 B2 | 6/2005 | Aiba et al. |
| 6,917,098 B1 | 7/2005 | Yamunan |
| 6,930,256 B1 | 8/2005 | Huemoeller et al. |
| 6,933,598 B2 | 8/2005 | Kamezos |
| 6,933,608 B2 | 8/2005 | Fujisawa |
| 6,939,723 B2 | 9/2005 | Corisis et al. |
| 6,946,380 B2 | 9/2005 | Takahashi |
| 6,951,773 B2 | 10/2005 | Ho et al. |
| 6,962,282 B2 | 11/2005 | Manansala |
| 6,962,864 B1 | 11/2005 | Jeng et al. |
| 6,977,440 B2 | 12/2005 | Pflughaupt et al. |
| 6,979,599 B2 | 12/2005 | Silverbrook |
| 6,987,032 B1* | 1/2006 | Fan ..................... H01L 21/561 257/E23.09 |
| 6,989,122 B1 | 1/2006 | Pham et al. |
| 7,009,297 B1 | 3/2006 | Chiang et al. |
| 7,017,794 B2 | 3/2006 | Nosaka |
| 7,021,521 B2 | 4/2006 | Sakurai et al. |
| 7,045,884 B2 | 5/2006 | Standing |
| 7,051,915 B2 | 5/2006 | Mutaguchi |
| 7,052,935 B2 | 5/2006 | Pai et al. |
| 7,053,477 B2 | 5/2006 | Kamezos et al. |
| 7,053,485 B2 | 5/2006 | Bang et al. |
| 7,061,079 B2 | 6/2006 | Weng et al. |
| 7,061,097 B2 | 6/2006 | Yokoi |
| 7,067,911 B1 | 6/2006 | Lin et al. |
| 7,071,028 B2 | 7/2006 | Koike et al. |
| 7,071,547 B2 | 7/2006 | Kang et al. |
| 7,071,573 B1 | 7/2006 | Lin |
| 7,078,788 B2 | 7/2006 | Vu et al. |
| 7,078,822 B2 | 7/2006 | Dias et al. |
| 7,095,105 B2 | 8/2006 | Cherukuri et al. |
| 7,112,520 B2 | 9/2006 | Lee et al. |
| 7,115,986 B2 | 10/2006 | Moon et al. |
| 7,119,427 B2 | 10/2006 | Kim |
| 7,121,891 B2 | 10/2006 | Cherian |
| 7,138,722 B2 | 11/2006 | Miyamoto et al. |
| 7,170,185 B1 | 1/2007 | Hogerton et al. |
| 7,176,043 B2 | 2/2007 | Haba et al. |
| 7,176,506 B2 | 2/2007 | Beroz et al. |
| 7,176,559 B2 | 2/2007 | Ho et al. |
| 7,185,426 B1 | 3/2007 | Hiner et al. |

(56) References Cited

U.S. PATENT DOCUMENTS

| | | | |
|---|---|---|---|
| 7,187,072 B2 | 3/2007 | Fukitomi et al. |
| 7,190,061 B2 | 3/2007 | Lee |
| 7,198,980 B2 | 4/2007 | Jiang et al. |
| 7,198,987 B1 | 4/2007 | Warren et al. |
| 7,205,670 B2 | 4/2007 | Oyama |
| 7,215,033 B2 | 5/2007 | Lee et al. |
| 7,216,794 B2 | 5/2007 | Lange et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,246,431 B2 | 7/2007 | Bang et al. |
| 7,256,069 B2 | 8/2007 | Akram et al. |
| 7,259,445 B2 | 8/2007 | Lau et al. |
| 7,262,124 B2 | 8/2007 | Fujisawa |
| 7,262,506 B2 | 8/2007 | Mess et al. |
| 7,268,421 B1 | 9/2007 | Lin |
| 7,276,799 B2 | 10/2007 | Lee et al. |
| 7,287,322 B2 * | 10/2007 | Mathieu ............ G01R 1/06727 29/842 |
| 7,294,920 B2 | 11/2007 | Chen et al. |
| 7,294,928 B2 | 11/2007 | Bang et al. |
| 7,298,033 B2 | 11/2007 | Yoo |
| 7,301,770 B2 | 11/2007 | Campbell et al. |
| 7,307,348 B2 | 12/2007 | Wood et al. |
| 7,321,164 B2 | 1/2008 | Hsu |
| 7,323,767 B2 | 1/2008 | James et al. |
| 7,327,038 B2 | 2/2008 | Kwon et al. |
| 7,342,803 B2 | 3/2008 | Inagaki et al. |
| 7,344,917 B2 | 3/2008 | Gautham |
| 7,345,361 B2 | 3/2008 | Malik et al. |
| 7,355,289 B2 | 3/2008 | Hess et al. |
| 7,365,416 B2 | 4/2008 | Kawabata et al. |
| 7,368,924 B2 | 5/2008 | Beaman et al. |
| 7,371,676 B2 | 5/2008 | Hembree |
| 7,372,151 B1 | 5/2008 | Fan et al. |
| 7,390,700 B2 | 6/2008 | Gerber et al. |
| 7,391,105 B2 | 6/2008 | Yeom |
| 7,391,121 B2 | 6/2008 | Otremba |
| 7,416,107 B2 | 8/2008 | Chapman et al. |
| 7,425,758 B2 | 9/2008 | Corisis et al. |
| 7,453,157 B2 | 11/2008 | Haba et al. |
| 7,456,091 B2 | 11/2008 | Kuraya et al. |
| 7,456,495 B2 | 11/2008 | Pohl et al. |
| 7,462,936 B2 | 12/2008 | Haba et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,495,644 B2 | 2/2009 | Hirakata |
| 7,504,284 B2 | 3/2009 | Ye et al. |
| 7,504,716 B2 | 3/2009 | Abbott |
| 7,517,733 B2 | 4/2009 | Camacho et al. |
| 7,527,505 B2 | 5/2009 | Murata |
| 7,535,090 B2 | 5/2009 | Furuyama et al. |
| 7,537,962 B2 | 5/2009 | Jang et al. |
| 7,538,565 B1 | 5/2009 | Beaman et al. |
| 7,550,836 B2 | 6/2009 | Chou et al. |
| 7,576,415 B2 | 8/2009 | Cha et al. |
| 7,576,439 B2 | 8/2009 | Craig et al. |
| 7,578,422 B2 | 8/2009 | Lange et al. |
| 7,582,963 B2 | 9/2009 | Gerber et al. |
| 7,589,394 B2 | 9/2009 | Kawano |
| 7,592,638 B2 | 9/2009 | Kim |
| 7,605,479 B2 | 10/2009 | Mohammed |
| 7,621,436 B2 | 11/2009 | Mii et al. |
| 7,625,781 B2 | 12/2009 | Beer |
| 7,629,695 B2 | 12/2009 | Yoshimura et al. |
| 7,633,154 B2 | 12/2009 | Dai et al. |
| 7,633,765 B1 | 12/2009 | Scanlan et al. |
| 7,642,133 B2 | 1/2010 | Wu et al. |
| 7,646,102 B2 | 1/2010 | Boon |
| 7,659,612 B2 | 2/2010 | Hembree et al. |
| 7,659,617 B2 | 2/2010 | Kang et al. |
| 7,663,226 B2 | 2/2010 | Cho et al. |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,683,460 B2 | 3/2010 | Heitzer et al. |
| 7,683,482 B2 | 3/2010 | Nishida et al. |
| 7,696,631 B2 | 4/2010 | Beaulieu et al. |
| 7,706,144 B2 | 4/2010 | Lynch |
| 7,709,968 B2 | 5/2010 | Damberg et al. |
| 7,719,122 B2 | 5/2010 | Tsao et al. |
| 7,723,839 B2 | 5/2010 | Yano et al. |
| 7,728,443 B2 | 6/2010 | Hembree |
| 7,737,545 B2 | 6/2010 | Fjelstad et al. |
| 7,750,483 B1 | 7/2010 | Lin et al. |
| 7,757,385 B2 | 7/2010 | Hembree |
| 7,759,782 B2 | 7/2010 | Haba et al. |
| 7,777,238 B2 | 8/2010 | Nishida et al. |
| 7,777,328 B2 | 8/2010 | Enomoto |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,807,512 B2 | 10/2010 | Lee et al. |
| 7,808,093 B2 | 10/2010 | Kagaya et al. |
| 7,834,464 B2 | 11/2010 | Meyer et al. |
| 7,838,334 B2 | 11/2010 | Yu et al. |
| 7,842,541 B1 | 11/2010 | Rusli et al. |
| 7,850,087 B2 | 12/2010 | Hwang et al. |
| 7,851,259 B2 | 12/2010 | Kim |
| 7,855,462 B2 | 12/2010 | Boon et al. |
| 7,855,464 B2 | 12/2010 | Shikano |
| 7,857,190 B2 | 12/2010 | Takahashi et al. |
| 7,859,033 B2 | 12/2010 | Brady |
| 7,872,335 B2 | 1/2011 | Khan et al. |
| 7,880,290 B2 | 2/2011 | Park |
| 7,892,889 B2 | 2/2011 | Howard et al. |
| 7,898,083 B2 | 3/2011 | Castro |
| 7,901,989 B2 | 3/2011 | Haba et al. |
| 7,902,644 B2 | 3/2011 | Huang et al. |
| 7,902,652 B2 | 3/2011 | Seo et al. |
| 7,911,805 B2 | 3/2011 | Haba |
| 7,919,846 B2 | 4/2011 | Hembree |
| 7,919,871 B2 | 4/2011 | Moon et al. |
| 7,923,295 B2 | 4/2011 | Shim et al. |
| 7,923,304 B2 | 4/2011 | Choi et al. |
| 7,928,552 B1 | 4/2011 | Cho et al. |
| 7,932,170 B1 | 4/2011 | Huemoeller et al. |
| 7,934,313 B1 | 5/2011 | Lin et al. |
| 7,939,934 B2 | 5/2011 | Haba et al. |
| 7,944,034 B2 | 5/2011 | Gerber et al. |
| 7,956,456 B2 | 6/2011 | Gurrum et al. |
| 7,960,843 B2 | 6/2011 | Hedler et al. |
| 7,964,956 B1 | 6/2011 | Bet-Shliemoun |
| 7,967,062 B2 | 6/2011 | Campbell et al. |
| 7,974,099 B2 | 7/2011 | Grajcar |
| 7,977,597 B2 | 7/2011 | Roberts et al. |
| 7,990,711 B1 | 8/2011 | Andry et al. |
| 7,994,622 B2 | 8/2011 | Mohammed et al. |
| 8,004,074 B2 | 8/2011 | Mori et al. |
| 8,004,093 B2 | 8/2011 | Oh et al. |
| 8,012,797 B2 | 9/2011 | Shen et al. |
| 8,017,437 B2 | 9/2011 | Yoo et al. |
| 8,017,452 B2 | 9/2011 | Ishihara et al. |
| 8,018,033 B2 | 9/2011 | Moriya |
| 8,018,065 B2 | 9/2011 | Lam |
| 8,020,290 B2 | 9/2011 | Sheats |
| 8,021,907 B2 | 9/2011 | Pagaila et al. |
| 8,035,213 B2 | 10/2011 | Lee et al. |
| 8,039,316 B2 | 10/2011 | Chi et al. |
| 8,039,960 B2 | 10/2011 | Lin |
| 8,039,970 B2 | 10/2011 | Yamamori et al. |
| 8,048,479 B2 | 11/2011 | Hedler et al. |
| 8,053,814 B2 | 11/2011 | Chen et al. |
| 8,053,879 B2 | 11/2011 | Lee et al. |
| 8,053,906 B2 | 11/2011 | Chang et al. |
| 8,058,101 B2 | 11/2011 | Haba et al. |
| 8,063,475 B2 | 11/2011 | Choi et al. |

(56) References Cited

U.S. PATENT DOCUMENTS

| | | |
|---|---|---|
| 8,071,424 B2 | 12/2011 | Kang et al. |
| 8,071,431 B2 | 12/2011 | Hoang et al. |
| 8,071,470 B2 | 12/2011 | Khor et al. |
| 8,076,765 B2 | 12/2011 | Chen et al. |
| 8,076,770 B2 | 12/2011 | Kagaya et al. |
| 8,080,445 B1 | 12/2011 | Pagaila |
| 8,084,867 B2 | 12/2011 | Tang et al. |
| 8,092,734 B2 | 1/2012 | Jiang et al. |
| 8,093,697 B2 | 1/2012 | Haba et al. |
| 8,106,498 B2 | 1/2012 | Shin et al. |
| 8,115,283 B1 | 2/2012 | Bolognia et al. |
| 8,119,516 B2 | 2/2012 | Endo |
| 8,120,054 B2 | 2/2012 | Seo et al. |
| 8,120,186 B2 | 2/2012 | Yoon |
| 8,138,584 B2 | 3/2012 | Wang et al. |
| 8,143,141 B2 | 3/2012 | Sun et al. |
| 8,143,710 B2 | 3/2012 | Cho |
| 8,158,888 B2 | 4/2012 | Shen et al. |
| 8,169,065 B2 | 5/2012 | Kohl et al. |
| 8,183,682 B2 | 5/2012 | Groenhuis et al. |
| 8,183,684 B2 | 5/2012 | Nakazato |
| 8,193,034 B2 | 6/2012 | Pagaila et al. |
| 8,194,411 B2 | 6/2012 | Leung et al. |
| 8,198,716 B2 | 6/2012 | Periaman et al. |
| 8,207,604 B2 | 6/2012 | Haba et al. |
| 8,213,184 B2 | 7/2012 | Knickerbocker |
| 8,217,502 B2 | 7/2012 | Ko |
| 8,225,982 B2 | 7/2012 | Pirkle et al. |
| 8,232,141 B2 | 7/2012 | Choi et al. |
| 8,258,010 B2 | 9/2012 | Pagaila et al. |
| 8,258,015 B2 | 9/2012 | Chow et al. |
| 8,263,435 B2 | 9/2012 | Choi et al. |
| 8,264,091 B2 | 9/2012 | Cho et al. |
| 8,269,335 B2 | 9/2012 | Osumi |
| 8,278,746 B2 | 10/2012 | Ding et al. |
| 8,288,854 B2 | 10/2012 | Weng et al. |
| 8,293,580 B2 | 10/2012 | Kim et al. |
| 8,299,368 B2 | 10/2012 | Endo |
| 8,304,900 B2 | 11/2012 | Jang et al. |
| 8,314,492 B2 | 11/2012 | Egawa |
| 8,318,539 B2 | 11/2012 | Cho et al. |
| 8,319,338 B1 | 11/2012 | Berry et al. |
| 8,324,633 B2 | 12/2012 | McKenzie et al. |
| 8,330,272 B2 | 12/2012 | Haba |
| 8,349,735 B2 | 1/2013 | Pagaila et al. |
| 8,362,620 B2 | 1/2013 | Pagani |
| 8,372,741 B1 | 2/2013 | Co et al. |
| 8,390,108 B2 | 3/2013 | Cho et al. |
| 8,390,117 B2 | 3/2013 | Shimizu et al. |
| 8,395,259 B2 | 3/2013 | Eun |
| 8,399,972 B2 | 3/2013 | Hoang et al. |
| 8,404,520 B1 * | 3/2013 | Chau .................. H01L 23/49517 228/155 |
| 8,409,922 B2 | 4/2013 | Camacho et al. |
| 8,415,704 B2 | 4/2013 | Ivanov et al. |
| 8,419,442 B2 | 4/2013 | Horikawa et al. |
| 8,435,899 B2 | 5/2013 | Miyata et al. |
| 8,450,839 B2 | 5/2013 | Corisis et al. |
| 8,476,115 B2 | 7/2013 | Choi et al. |
| 8,476,770 B2 | 7/2013 | Shao et al. |
| 8,482,111 B2 | 7/2013 | Haba |
| 8,487,421 B2 | 7/2013 | Sato et al. |
| 8,502,387 B2 | 8/2013 | Choi et al. |
| 8,507,297 B2 | 8/2013 | Iida et al. |
| 8,508,045 B2 | 8/2013 | Khan et al. |
| 8,518,746 B2 | 8/2013 | Pagaila et al. |
| 8,520,396 B2 | 8/2013 | Schmidt et al. |
| 8,525,214 B2 | 9/2013 | Lin et al. |
| 8,525,314 B2 | 9/2013 | Haba et al. |
| 8,525,318 B1 | 9/2013 | Kim et al. |
| 8,552,556 B1 | 10/2013 | Kim et al. |
| 8,558,379 B2 | 10/2013 | Kwon |
| 8,558,392 B2 | 10/2013 | Chua et al. |
| 8,564,141 B2 | 10/2013 | Lee et al. |
| 8,569,892 B2 | 10/2013 | Mori et al. |
| 8,580,607 B2 | 11/2013 | Haba |
| 8,598,717 B2 | 12/2013 | Masuda |
| 8,618,646 B2 | 12/2013 | Sasaki et al. |
| 8,618,659 B2 | 12/2013 | Sato et al. |
| 8,624,374 B2 | 1/2014 | Ding et al. |
| 8,637,991 B2 | 1/2014 | Haba |
| 8,642,393 B1 | 2/2014 | Yu et al. |
| 8,646,508 B2 | 2/2014 | Kawada |
| 8,653,626 B2 | 2/2014 | Lo et al. |
| 8,653,676 B2 | 2/2014 | Kim et al. |
| 8,659,164 B2 | 2/2014 | Haba |
| 8,664,780 B2 | 3/2014 | Han et al. |
| 8,669,646 B2 | 3/2014 | Tabatabai et al. |
| 8,680,662 B2 | 3/2014 | Haba et al. |
| 8,680,677 B2 | 3/2014 | Nyland |
| 8,680,684 B2 | 3/2014 | Haba et al. |
| 8,685,792 B2 | 4/2014 | Chow et al. |
| 8,697,492 B2 | 4/2014 | Haba et al. |
| 8,723,307 B2 | 5/2014 | Jiang et al. |
| 8,728,865 B2 | 5/2014 | Haba et al. |
| 8,729,714 B1 | 5/2014 | Meyer |
| 8,742,576 B2 | 6/2014 | Thacker et al. |
| 8,742,597 B2 | 6/2014 | Nickerson |
| 8,772,817 B2 | 7/2014 | Yao |
| 8,785,245 B2 | 7/2014 | Kim |
| 8,791,575 B2 | 7/2014 | Oganesian et al. |
| 8,791,580 B2 | 7/2014 | Park et al. |
| 8,796,846 B2 | 8/2014 | Lin et al. |
| 8,802,494 B2 | 8/2014 | Lee et al. |
| 8,811,055 B2 | 8/2014 | Yoon |
| 8,836,136 B2 | 9/2014 | Chau et al. |
| 8,836,147 B2 | 9/2014 | Uno et al. |
| 8,841,765 B2 | 9/2014 | Haba et al. |
| 8,846,521 B2 | 9/2014 | Sugizaki |
| 8,847,376 B2 | 9/2014 | Oganesian et al. |
| 8,853,558 B2 | 10/2014 | Gupta et al. |
| 8,878,353 B2 * | 11/2014 | Haba .................. H01L 23/528 257/686 |
| 8,884,416 B2 | 11/2014 | Lee et al. |
| 8,907,466 B2 | 12/2014 | Haba |
| 8,907,500 B2 | 12/2014 | Haba et al. |
| 8,912,651 B2 | 12/2014 | Yu et al. |
| 8,916,781 B2 | 12/2014 | Haba et al. |
| 8,922,005 B2 | 12/2014 | Hu et al. |
| 8,927,337 B2 | 1/2015 | Haba et al. |
| 8,937,309 B2 | 1/2015 | England et al. |
| 8,940,630 B2 | 1/2015 | Damberg et al. |
| 8,940,636 B2 | 1/2015 | Pagaila et al. |
| 8,946,757 B2 | 2/2015 | Mohammed et al. |
| 8,963,339 B2 | 2/2015 | He et al. |
| 8,970,049 B2 | 3/2015 | Kamezos |
| 8,975,726 B2 | 3/2015 | Chen |
| 8,978,247 B2 | 3/2015 | Yang et al. |
| 8,981,559 B2 | 3/2015 | Hsu et al. |
| 8,987,132 B2 | 3/2015 | Gruber et al. |
| 8,988,895 B2 | 3/2015 | Mohammed et al. |
| 8,993,376 B2 | 3/2015 | Camacho et al. |
| 9,006,031 B2 | 4/2015 | Camacho et al. |
| 9,012,263 B1 | 4/2015 | Mathew et al. |
| 9,041,227 B2 | 5/2015 | Chau et al. |
| 9,054,095 B2 | 6/2015 | Pagaila |
| 9,082,763 B2 | 7/2015 | Yu et al. |
| 9,093,435 B2 | 7/2015 | Sato et al. |
| 9,095,074 B2 | 7/2015 | Haba et al. |
| 9,105,483 B2 | 8/2015 | Chau et al. |
| 9,105,552 B2 | 8/2015 | Yu et al. |
| 9,117,811 B2 | 8/2015 | Zohni |
| 9,123,664 B2 | 9/2015 | Haba |
| 9,136,254 B2 | 9/2015 | Zhao et al. |
| 9,142,586 B2 | 9/2015 | Wang et al. |
| 9,153,562 B2 | 10/2015 | Haba et al. |
| 9,171,790 B2 | 10/2015 | Yu et al. |
| 9,177,832 B2 | 11/2015 | Camacho |
| 9,196,586 B2 | 11/2015 | Chen et al. |
| 9,196,588 B2 | 11/2015 | Leal |
| 9,214,434 B1 | 12/2015 | Kim et al. |
| 9,224,647 B2 | 12/2015 | Koo et al. |
| 9,224,717 B2 | 12/2015 | Sato et al. |
| 9,258,922 B2 | 2/2016 | Chen et al. |

(56) References Cited

U.S. PATENT DOCUMENTS

| | | | |
|---|---|---|---|
| 9,263,394 B2 | 2/2016 | Uzoh et al. |
| 9,263,413 B2 | 2/2016 | Mohammed |
| 9,299,670 B2 | 3/2016 | Yap et al. |
| 9,318,452 B2 | 4/2016 | Chen et al. |
| 9,324,696 B2 | 4/2016 | Choi et al. |
| 9,349,706 B2 | 5/2016 | Co et al. |
| 9,362,161 B2 | 6/2016 | Chi et al. |
| 9,379,074 B2 | 6/2016 | Uzoh et al. |
| 9,379,078 B2 | 6/2016 | Yu et al. |
| 9,401,338 B2 | 7/2016 | Magnus et al. |
| 9,412,661 B2 | 8/2016 | Lu et al. |
| 9,418,940 B2 | 8/2016 | Hoshino et al. |
| 9,418,971 B2 | 8/2016 | Chen et al. |
| 9,437,459 B2 | 9/2016 | Carpenter et al. |
| 9,443,797 B2 | 9/2016 | Marimuthu et al. |
| 9,449,941 B2 | 9/2016 | Tsai et al. |
| 9,461,025 B2 | 10/2016 | Yu et al. |
| 9,496,152 B2 | 11/2016 | Cho et al. |
| 9,502,390 B2 | 11/2016 | Caskey et al. |
| 9,559,088 B2 | 1/2017 | Gonzalez et al. |
| 9,601,454 B2 * | 3/2017 | Zhao | H01L 23/49811 |
| 9,761,558 B2 * | 9/2017 | Chau | H01L 24/85 |
| 2001/0042925 A1 | 11/2001 | Yamamoto et al. |
| 2002/0014004 A1 | 2/2002 | Beaman et al. |
| 2002/0125556 A1 | 9/2002 | Oh et al. |
| 2002/0171152 A1 | 11/2002 | Miyazaki |
| 2003/0006494 A1 | 1/2003 | Lee et al. |
| 2003/0048108 A1 | 3/2003 | Beaman et al. |
| 2003/0057544 A1 | 3/2003 | Nathan et al. |
| 2003/0094666 A1 | 5/2003 | Clayton et al. |
| 2003/0162378 A1 | 8/2003 | Mikami |
| 2004/0041757 A1 | 3/2004 | Yang et al. |
| 2004/0262728 A1 | 12/2004 | Sterrett et al. |
| 2005/0017369 A1 | 1/2005 | Clayton et al. |
| 2005/0062492 A1 | 3/2005 | Beaman et al. |
| 2005/0082664 A1 | 4/2005 | Funaba et al. |
| 2005/0095835 A1 | 5/2005 | Humpston et al. |
| 2005/0161814 A1 | 7/2005 | Mizukoshi et al. |
| 2005/0173805 A1 * | 8/2005 | Damberg | H01L 23/49811 |
| | | | 257/773 |
| 2005/0173807 A1 | 8/2005 | Zhu et al. |
| 2005/0176233 A1 | 8/2005 | Joshi et al. |
| 2006/0053909 A1 * | 3/2006 | Shirasaka | B81B 7/007 |
| | | | 73/866.1 |
| 2006/0087006 A1 * | 4/2006 | Shirasaka | B81B 7/0077 |
| | | | 257/619 |
| 2006/0087013 A1 | 4/2006 | Hsieh |
| 2006/0255449 A1 | 11/2006 | Lee et al. |
| 2007/0010086 A1 | 1/2007 | Hsieh |
| 2007/0080360 A1 | 4/2007 | Mirsky et al. |
| 2007/0190747 A1 | 8/2007 | Hup |
| 2007/0254406 A1 | 11/2007 | Lee |
| 2007/0271781 A9 | 11/2007 | Beaman et al. |
| 2007/0290325 A1 | 12/2007 | Wu et al. |
| 2008/0006942 A1 | 1/2008 | Park et al. |
| 2008/0017968 A1 | 1/2008 | Choi et al. |
| 2008/0023805 A1 | 1/2008 | Howard et al. |
| 2008/0042265 A1 | 2/2008 | Merilo et al. |
| 2008/0047741 A1 | 2/2008 | Beaman et al. |
| 2008/0048690 A1 | 2/2008 | Beaman et al. |
| 2008/0048691 A1 | 2/2008 | Beaman et al. |
| 2008/0048697 A1 | 2/2008 | Beaman et al. |
| 2008/0054434 A1 | 3/2008 | Kim |
| 2008/0073769 A1 | 3/2008 | Wu et al. |
| 2008/0100316 A1 | 5/2008 | Beaman et al. |
| 2008/0100317 A1 | 5/2008 | Beaman et al. |
| 2008/0100318 A1 | 5/2008 | Beaman et al. |
| 2008/0100324 A1 | 5/2008 | Beaman et al. |
| 2008/0105984 A1 | 5/2008 | Lee et al. |
| 2008/0106281 A1 | 5/2008 | Beaman et al. |
| 2008/0106282 A1 | 5/2008 | Beaman et al. |
| 2008/0106283 A1 | 5/2008 | Beaman et al. |
| 2008/0106284 A1 | 5/2008 | Beaman et al. |
| 2008/0106285 A1 | 5/2008 | Beaman et al. |
| 2008/0106291 A1 | 5/2008 | Beaman et al. |
| 2008/0106872 A1 | 5/2008 | Beaman et al. |
| 2008/0111568 A1 | 5/2008 | Beaman et al. |
| 2008/0111569 A1 | 5/2008 | Beaman et al. |
| 2008/0111570 A1 | 5/2008 | Beaman et al. |
| 2008/0112144 A1 | 5/2008 | Beaman et al. |
| 2008/0112145 A1 | 5/2008 | Beaman et al. |
| 2008/0112146 A1 | 5/2008 | Beaman et al. |
| 2008/0112147 A1 | 5/2008 | Beaman et al. |
| 2008/0112148 A1 | 5/2008 | Beaman et al. |
| 2008/0112149 A1 | 5/2008 | Beaman et al. |
| 2008/0116912 A1 | 5/2008 | Beaman et al. |
| 2008/0116913 A1 | 5/2008 | Beaman et al. |
| 2008/0116914 A1 | 5/2008 | Beaman et al. |
| 2008/0116915 A1 | 5/2008 | Beaman et al. |
| 2008/0116916 A1 | 5/2008 | Beaman et al. |
| 2008/0117611 A1 | 5/2008 | Beaman et al. |
| 2008/0117612 A1 | 5/2008 | Beaman et al. |
| 2008/0117613 A1 | 5/2008 | Beaman et al. |
| 2008/0121879 A1 | 5/2008 | Beaman et al. |
| 2008/0123310 A1 | 5/2008 | Beaman et al. |
| 2008/0129319 A1 | 6/2008 | Beaman et al. |
| 2008/0129320 A1 | 6/2008 | Beaman et al. |
| 2008/0132094 A1 | 6/2008 | Beaman et al. |
| 2008/0156518 A1 | 7/2008 | Honer et al. |
| 2008/0164595 A1 | 7/2008 | Wu et al. |
| 2008/0169548 A1 | 7/2008 | Baek |
| 2008/0217708 A1 | 9/2008 | Reisner et al. |
| 2008/0280393 A1 | 11/2008 | Lee et al. |
| 2008/0284045 A1 | 11/2008 | Gerber et al. |
| 2008/0303153 A1 * | 12/2008 | Oi | H01L 21/563 |
| | | | 257/738 |
| 2008/0308305 A1 | 12/2008 | Kawabe |
| 2009/0008796 A1 | 1/2009 | Eng et al. |
| 2009/0014876 A1 | 1/2009 | Youn et al. |
| 2009/0032913 A1 | 2/2009 | Haba |
| 2009/0085185 A1 | 4/2009 | Byun et al. |
| 2009/0091009 A1 | 4/2009 | Corisis et al. |
| 2009/0102063 A1 | 4/2009 | Lee et al. |
| 2009/0127686 A1 | 5/2009 | Yang et al. |
| 2009/0128176 A1 | 5/2009 | Beaman et al. |
| 2009/0140415 A1 | 6/2009 | Furuta |
| 2009/0166664 A1 | 7/2009 | Park et al. |
| 2009/0189288 A1 * | 7/2009 | Beaman | B23K 20/004 |
| | | | 257/773 |
| 2009/0194829 A1 | 8/2009 | Chung et al. |
| 2009/0256229 A1 | 10/2009 | Ishikawa et al. |
| 2009/0315192 A1 * | 12/2009 | Usami | H01L 21/561 |
| | | | 257/787 |
| 2009/0315579 A1 | 12/2009 | Beaman et al. |
| 2010/0044860 A1 | 2/2010 | Haba et al. |
| 2010/0078795 A1 | 4/2010 | Dekker et al. |
| 2010/0193937 A1 | 8/2010 | Nagamatsu et al. |
| 2010/0200981 A1 | 8/2010 | Huang et al. |
| 2010/0258955 A1 | 10/2010 | Miyagawa et al. |
| 2010/0289142 A1 | 11/2010 | Shim et al. |
| 2010/0314748 A1 | 12/2010 | Hsu et al. |
| 2010/0327419 A1 | 12/2010 | Muthukumar et al. |
| 2011/0042699 A1 | 2/2011 | Park et al. |
| 2011/0068478 A1 | 3/2011 | Pagaila et al. |
| 2011/0157834 A1 | 6/2011 | Wang |
| 2011/0183464 A1 * | 7/2011 | Takahashi | C09J 5/06 |
| | | | 438/108 |
| 2012/0043655 A1 | 2/2012 | Khor et al. |
| 2012/0063090 A1 | 3/2012 | Hsiao et al. |
| 2012/0080787 A1 | 4/2012 | Shah et al. |
| 2012/0086111 A1 | 4/2012 | Iwamoto et al. |
| 2012/0126431 A1 | 5/2012 | Kim et al. |
| 2012/0153444 A1 | 6/2012 | Haga et al. |
| 2012/0184116 A1 | 7/2012 | Pawlikowski et al. |
| 2013/0001797 A1 | 1/2013 | Choi et al. |
| 2013/0049218 A1 | 2/2013 | Gong et al. |
| 2013/0087915 A1 | 4/2013 | Warren et al. |
| 2013/0095610 A1 | 4/2013 | Chau et al. |
| 2013/0153646 A1 | 6/2013 | Ho |
| 2013/0200524 A1 | 8/2013 | Han et al. |
| 2013/0234317 A1 | 9/2013 | Chen et al. |
| 2013/0256847 A1 | 10/2013 | Park et al. |
| 2013/0323409 A1 | 12/2013 | Read et al. |
| 2013/0328178 A1 | 12/2013 | Bakalski et al. |

(56) References Cited

U.S. PATENT DOCUMENTS

| | | | |
|---|---|---|---|
| 2014/0035892 A1 | 2/2014 | Shenoy et al. | |
| 2014/0103527 A1 | 4/2014 | Marimuthu et al. | |
| 2014/0124949 A1 | 5/2014 | Paek et al. | |
| 2014/0175657 A1 | 6/2014 | Oka et al. | |
| 2014/0225248 A1 | 8/2014 | Henderson et al. | |
| 2014/0239479 A1 | 8/2014 | Start | |
| 2014/0239490 A1 | 8/2014 | Wang | |
| 2014/0308907 A1 | 10/2014 | Chen | |
| 2014/0312503 A1 | 10/2014 | Sec | |
| 2015/0044823 A1 | 2/2015 | Mohammed | |
| 2015/0076714 A1 | 3/2015 | Haba et al. | |
| 2015/0130054 A1 | 5/2015 | Lee et al. | |
| 2015/0206865 A1 | 7/2015 | Yu et al. | |
| 2015/0340305 A1 | 11/2015 | Lo | |
| 2015/0380376 A1 | 12/2015 | Mathew et al. | |
| 2016/0043813 A1 | 2/2016 | Chen et al. | |
| 2016/0172268 A1 | 6/2016 | Katkar et al. | |
| 2016/0200566 A1 | 7/2016 | Ofner et al. | |
| 2016/0225692 A1 | 8/2016 | Kim et al. | |

FOREIGN PATENT DOCUMENTS

| | | |
|---|---|---|
| CN | 1877824 A | 12/2006 |
| CN | 101409241 A | 4/2009 |
| CN | 101449375 A | 6/2009 |
| CN | 101675516 A | 3/2010 |
| CN | 101819959 A | 9/2010 |
| CN | 102324418 A | 1/2012 |
| DE | 102009001461 A1 | 9/2010 |
| EP | 920058 | 6/1999 |
| EP | 1449414 A1 | 8/2004 |
| EP | 2234158 A1 | 9/2010 |
| JP | S51-050661 | 5/1976 |
| JP | 59189069 A | 10/1984 |
| JP | 61125062 A | 6/1986 |
| JP | S62158338 A | 7/1987 |
| JP | 62-226307 | 10/1987 |
| JP | 1012769 A | 1/1989 |
| JP | 64-71162 | 3/1989 |
| JP | 1118364 | 5/1989 |
| JP | H04-346436 A | 12/1992 |
| JP | 06268015 A | 9/1994 |
| JP | H06333931 A | 12/1994 |
| JP | 07-122787 A | 5/1995 |
| JP | 09505439 | 5/1997 |
| JP | H1065054 A | 3/1998 |
| JP | H10135220 A | 5/1998 |
| JP | H10135221 A | 5/1998 |
| JP | 11-074295 A | 3/1999 |
| JP | 11135663 A | 5/1999 |
| JP | H11-145323 A | 5/1999 |
| JP | 11251350 A | 9/1999 |
| JP | H11260856 A | 9/1999 |
| JP | 11317476 | 11/1999 |
| JP | 2001196407 A | 7/2001 |
| JP | 2001326236 A | 11/2001 |
| JP | 2002289769 A | 10/2002 |
| JP | 2003122611 A | 4/2003 |
| JP | 2003-174124 A | 6/2003 |
| JP | 2003307897 A | 10/2003 |
| JP | 2004031754 A | 1/2004 |
| JP | 200447702 | 2/2004 |
| JP | 2004047702 A | 2/2004 |
| JP | 2004-172157 A | 6/2004 |
| JP | 2004-200316 | 7/2004 |
| JP | 2004281514 A | 10/2004 |
| JP | 2004-319892 A | 11/2004 |
| JP | 2004327855 A | 11/2004 |
| JP | 2004327856 A | 11/2004 |
| JP | 2004343030 A | 12/2004 |
| JP | 2005011874 A | 1/2005 |
| JP | 2005033141 A | 2/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 | 7/2005 |
| JP | 2005183923 A | 7/2005 |
| JP | 2005203497 A | 7/2005 |
| JP | 2005302765 A | 10/2005 |
| JP | 2006108588 A | 4/2006 |
| JP | 2006186086 A | 7/2006 |
| JP | 2006344917 | 12/2006 |
| JP | 2007123595 A | 5/2007 |
| JP | 2007-208159 A | 8/2007 |
| JP | 2007234845 A | 9/2007 |
| JP | 2007287922 A | 11/2007 |
| JP | 2007-335464 A | 12/2007 |
| JP | 2008166439 A | 7/2008 |
| JP | 2008171938 A | 7/2008 |
| JP | 2008251794 A | 10/2008 |
| JP | 2008277362 A | 11/2008 |
| JP | 2008306128 A | 12/2008 |
| JP | 2009004650 A | 1/2009 |
| JP | 2009044110 A | 2/2009 |
| JP | 2009506553 | 2/2009 |
| JP | 2009508324 A | 2/2009 |
| JP | 2009528706 A | 8/2009 |
| JP | 2009260132 A | 11/2009 |
| JP | 2010103129 A | 5/2010 |
| JP | 201092928 A | 9/2010 |
| JP | 2010199528 A | 9/2010 |
| JP | 2010206007 A | 9/2010 |
| KR | 100265563 | 9/2000 |
| KR | 20010061849 A | 7/2001 |
| KR | 2001-0094894 A | 11/2001 |
| KR | 10-0393102 | 7/2002 |
| KR | 20020058216 A | 7/2002 |
| KR | 20060064291 A | 6/2006 |
| KR | 10-2007-0058680 A | 6/2007 |
| KR | 20080020069 A | 3/2008 |
| KR | 100865125 B1 | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 10-2010-0050750 A | 5/2010 |
| KR | 20100062315 A | 6/2010 |
| KR | 101011863 B1 | 1/2011 |
| KR | 20120075855 A | 7/2012 |
| KR | 20150012285 A | 2/2015 |
| TW | 200539406 A | 12/2005 |
| TW | 200810079 A | 2/2008 |
| TW | 200849551 A | 12/2008 |
| TW | 200933760 A | 8/2009 |
| TW | 201023277 A | 6/2010 |
| TW | 201250979 A | 12/2012 |
| WO | 02/13256 A1 | 2/2002 |
| WO | 03045123 A1 | 5/2003 |
| WO | 2004077525 A2 | 9/2004 |
| WO | 2006050691 A2 | 5/2006 |
| WO | 2007101251 A2 | 9/2007 |
| WO | 2008065896 A1 | 6/2008 |
| WO | 2008120755 A1 | 10/2008 |
| WO | 2009096950 A1 | 8/2009 |
| WO | 2010041630 A1 | 4/2010 |
| WO | 2010101163 A1 | 9/2010 |
| WO | 2012067177 A1 | 5/2012 |
| WO | 2013059181 A1 | 4/2013 |
| WO | 2013065895 A1 | 5/2013 |
| WO | 2014107301 A1 | 7/2014 |

OTHER PUBLICATIONS

"Wafer Level Stack—WDoD", [online]. [Retrieved Aug. 5, 2010]. Retrieved from the Internet. <http://www.3d-plus.com/techno-wafer-level-stack-wdod.php>, 2 pages.

Bang, U.S. Appl. No. 10/656,534, filed Sep. 5, 2001.

Chinese Office Action for Application No. 201180022247.8 dated Apr. 14, 2015.

Chinese Office Action for Application No. 201180022247.8 dated Sep. 16, 2014.

(56) References Cited

OTHER PUBLICATIONS

Chinese Office Action for Application No. 201310264264.3 dated May 12, 2015.
Extended European Search Report for Application No. EP13162975 dated Sep. 5, 2013.
International Search Report and Written Opinion for Application No. PCT/US2011/024143 dated Jan. 17, 2012.
International Search Report and Written Opinion for Application No. PCT/US2011/044346 dated May 11, 2012.
International Search Report and Written Opinion for Application No. PCT/US2012/060402 dated Apr. 2, 2011.
International Search Report and Written Opinion for Application No. PCT/US2013/026126 dated Jul. 25, 2013.
International Search Report and Written Opinion for Application No. PCT/US2013/041981 dated Nov. 13, 2013.
International Search Report and Written Opinion for Application No. PCT/US2013/052883 dated Oct. 21, 2013.
International Search Report and Written Opinion for Application No. PCT/US2013/053437 dated Nov. 25, 2013.
International Search Report and Written Opinion for Application No. PCT/US2013/075672 dated Apr. 22, 2014.
International Search Report and Written Opinion for Application No. PCT/US2015/011715 dated Apr. 20, 2015.
International Search Report and Written Opinion for PCT/US2011/060551 dated Apr. 18, 2012.
International Search Report and Written Opinion PCT/US2011/044342 dated May 7, 2012.
International Search Report Application No. PCT/US2011/024143, dated Sep. 14, 2011.
International Search Report, PCT/US2005/039716, Apr. 5, 2006.
Japanese Office Action for Application No. 2013-509325 dated Oct. 18, 2013.
Japanese Office Action for Application No. 2013-520776 dated Apr. 21, 2015.
Japanese Office Action for Application No. 2013-520777 dated May 22, 2015.
Jin, Yonggang et al., "STM 3D-IC Package and 3D eWLB Development," STMicroelectronics Singapore/STMicroelectronics France, May 21, 2010.
Kim et al., "Application of Through Mold Via (TMV) as PoP base package", 6 pages (2008).
Korean Office Action for Application No. 10-2011-0041843 dated Jun. 20, 2011.
Korean Office Action for Application No. 2014-7025992 dated Feb. 5, 2015.
Korean Search Report KR10-2011-0041843 dated Feb. 24, 2011.
Meiser S, "Klein Und Komplex", Elektronik, IRL Press Limited, DE, vol. 41, No. 1, Jan. 7, 1992 (Jan. 7, 1992), pp. 72-77, XP000277326. (International Search Report for Application No. PCT/US2012/060402 dated Feb. 21, 2013 provides concise statement of relevance.).
Neo-Manhattan Technology, A Novel HDI Manufacturing Process, "High-Density Interconnects for Advanced Flex Substrates & 3-D Package Stacking, "IPC Flex & Chips Symposium, Tempe, AZ, Feb. 11-12, 2003.
North Corporation, "Processed Intra-layer Interconnection Material for PWBs [Etched Copper Bump with Copper Foil]," NIMBITM, Version 2001.6.
Office Action for Taiwan Application No. 100125521 dated Dec. 20, 2013.
Office Action from Taiwan for Application No. 100125522 dated Jan. 27, 2014.
Office Action from U.S. Appl. No. 12/769,930 dated May 5, 2011.
Partial International Search Report for Application No. PCT/US2012/060402 dated Feb. 21, 2013.
Partial International Search Report for Application No. PCT/US2013/026126 dated Jun. 17, 2013.
Partial International Search Report for Application No. PCT/US2013/075672 dated Mar. 12, 2014.
Partial International Search Report for Application No. PCT/US2015/033004 dated Sep. 9, 2015.
Partial International Search Report from Invitation to Pay Additional Fees for Application No. PCT/US2012/028738 dated Jun. 6, 2012.
Redistributed Chip Package (RCP) Technology, Freescale Semiconductor, 2005, 6 pages.
Search Report from Korean Patent Application No. 10-2010-0113271 dated Jan. 12, 2011.
Taiwanese Office Action for Application No. 102106326 dated Sep. 8, 2015.
Taiwanese Office Action for Application No. 100140428 dated Jan. 26, 2015.
Taiwanese Office Action for Application No. 100141695 dated Mar. 19, 2014.
Taiwanese Office Action for Application No. 101138311 dated Jun. 27, 2014.
Yoon, PhD, Seung Wook, "Next Generation Wafer Level Packaging Solution for 3D integration," May 2010, Stats ChipPAC Ltd.
Ghaffarian Ph.D., Reza et al., "Evaluation Methodology Guidance for Stack Packages," Jet Propulsion Laboratory, California Institute of Technology, Pasadena, CA, NASA, Oct. 2009, 44 pages.
IBM et al., "Method of Producing Thin-Film Wirings with Vias," IBM Technical Disclosure Bulletin, Apr. 1, 1989, IBM Corp., (Thornwood), US-ISSN 0018-8689, vol. 31, No. 11, pp. 209-210, https://priorart.ip.com.
International Search Report and Written Opinion for Appln. No. PCT/US2014/014181, dated Jun. 13, 2014.
International Search Report and Written Opinion for Appln. No. PCT/US2014/050125, dated Feb. 4, 2015.
International Search Report and Written Opinion for Appln. No. PCT/US2014/050148, dated Feb. 9, 2015.
International Search Report and Written Opinion for Appln. No. PCT/US2014/055695, dated Mar. 20, 2015.
International Search Report and Written Opinion for Appln. No. PCT/US2014/055695, dated Dec. 15, 2015.
International Search Report and Written Opinion for Appln. No. PCT/US2016/056402, dated Jan. 31, 2017.
NTK HTCC Package General Design Guide, Communication Media Components Group, NGK Spark Plug Co., Ltd., Komaki, Aichi, Japan, Apr. 2010, 32 pages.
Partial International Search Report for Appln. No. PCT/US2014/014181, dated May 8, 2014.
Taiwan Office Action for 103103350, dated Mar. 21, 2016.
U.S. Appl. No. 13/477,532, dated May 22, 2012.
Written Opinion for Appln. No. PCT/US2014/050125, dated Jul. 15, 2015.
Brochure, "High Performance BVA PoP Package for Mobile Systems," Invensas Corporation, May 2013, 20 pages.
Brochure, "Invensas BVA PoP for Mobile Computing: Ultra High IO Without TSVs," Invensas Corporation, Jun. 26, 2012, 4 pages.
Brochure, "Invensas BVA PoP for Mobile Computing: 100+ GB/s BVA PoP," Invensas Corporation, c. 2012, 2 pages.
Campos et al., "System in Package Solutions Using Fan-Out Wafer Level Packaging Technology," SEMI Networking Day, Jun. 27, 2013, 31 pages.

* cited by examiner

PRESSING OF WIRE BOND WIRE TIPS TO PROVIDE BENT-OVER TIPS

FIELD

The following description relates to microelectronic devices. More particularly, the following description relates to pressing of wire bond wire tips to provide bent over tips for a microelectronic device.

BACKGROUND

Microelectronic assemblies generally include one or more integrated circuit dies ("ICs"), such as for example one or more packaged ICs ("chips"). One or more of such chips may be mounted on a circuit platform, such as on a wafer for wafer-level-packaging ("WLP"), a package substrate, an interposer, or a carrier. Additionally, one chip may be mounted on another chip for a package-on-package ("PoP") part.

A chip may include conductive elements, such as pathways, traces, tracks, vias, contacts, pads such as contact pads and bond pads, plugs, nodes, or terminals for example, that may be used for making electrical interconnections with another circuit platform. These arrangements may facilitate electrical connections used to provide functionality of ICs. A chip may be coupled to a circuit platform by bonding, such as bonding traces or terminals, for example, of such circuit platform to bond pads or exposed ends of pins or posts or the like of a chip. Interconnecting of one chip to another chip or to a circuit platform is relevant to reliability.

Accordingly, it would be desirable and useful to provide interconnects that enhance reliability.

BRIEF SUMMARY

A method relates generally to forming a microelectronic device. In such a method, a substrate for the microelectronic device is loaded into a mold press. The substrate has a first surface and a second surface. The second surface is placed on an interior lower surface of the mold press. The substrate has a plurality of wire bond wires extending from the first surface toward an interior upper surface of the mold press. An upper surface of a mold film is indexed to the interior upper surface of the mold press. A lower surface of the mold film is punctured with tips of the plurality of wire bond wires for having the tips of the plurality of wire bond wires extending above the lower surface of the mold film into the mold film. The tips of the plurality of wire bond wires are pressed down toward the lower surface of the mold film to bend the tips over.

Another method relates generally to forming a microelectronic device. In such other method, a substrate for the microelectronic device is loaded into a mold press. The substrate has a first surface and a second surface. The second surface is placed on an interior lower surface of the mold press. The substrate has a plurality of wire bond wires extending from the first surface toward an interior upper surface of the mold press. An upper surface of a mold film is indexed to the interior upper surface of the mold press. A lower surface of the mold film is punctured with tips of the plurality of wire bond wires for having the tips of the plurality of wire bond wires located in the mold film between the upper surface and the lower surface. A molding material is injected between the first surface of the substrate and the lower surface of the mold film. The molding material is cured to provide a molding layer. The mold film is removed from the substrate. The tips of the plurality of wire bond wires are pressed down toward an upper surface of the molding layer to bend the tips over.

An apparatus relates generally to a microelectronic device. In such an apparatus, a substrate has a first surface and a second surface opposite the first surface. The substrate has a plurality of wire bond wires extending from the first surface. The substrate has a mold material layer on the first surface. Tips of the plurality of wire bond wires extend beyond an upper surface of the mold material layer, and the tips are bent over.

Other features will be recognized from consideration of the Detailed Description and Claims, which follow.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

FIGS. 7-1 through 7-6 are a progression of block diagrams of a side cutaway view depicting an exemplary manufacturing process having operations for forming a microelectronic device.

FIGS. 8-1 through 8-4 are a progression of block diagrams of a side cutaway view depicting another exemplary manufacturing process having operations for forming a microelectronic device.

FIGS. 10-1 and 10-2 are block diagrams of a side cutaway view depicting yet another exemplary substrate after another manufacturing process having operations for forming a microelectronic device but with an upper portion of an arm of wire bond wires, longer than an uppermost portion thereof, embedded in mold film.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

As previously described, chip to chip or wiring platform interconnects are relevant to reliability. As described below, wire bond wire tips may be pressed to provide bent over shaped tips for interconnects for a microelectronic device. These bent over shaped tips may provide anchors for interconnecting a microelectronic device to an IC, a chip, and/or a wiring platform. These anchors may be used to enhance reliability of such interconnects.

Figure 1:
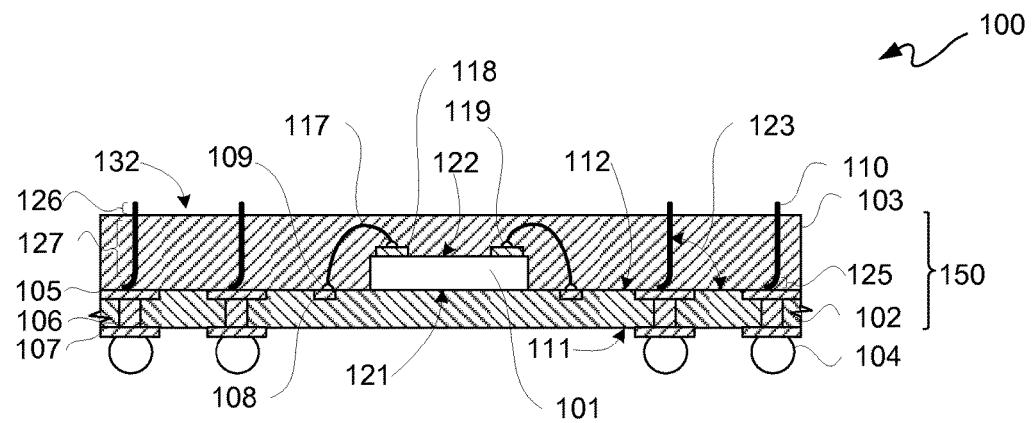
FIG. 1 is a respective block diagram of a cross-sectional side view depicting an implementation of a microelectronic device.
Figure 2:
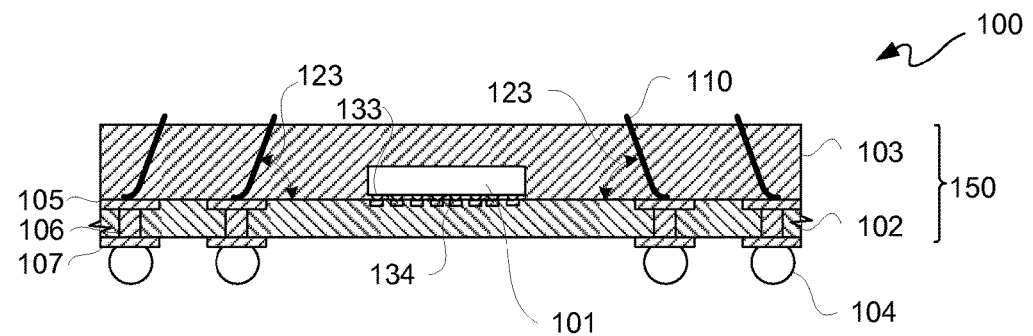
FIG. 2 is a respective block diagram of a cross-sectional side view depicting an implementation of a microelectronic device.
Figure 3:
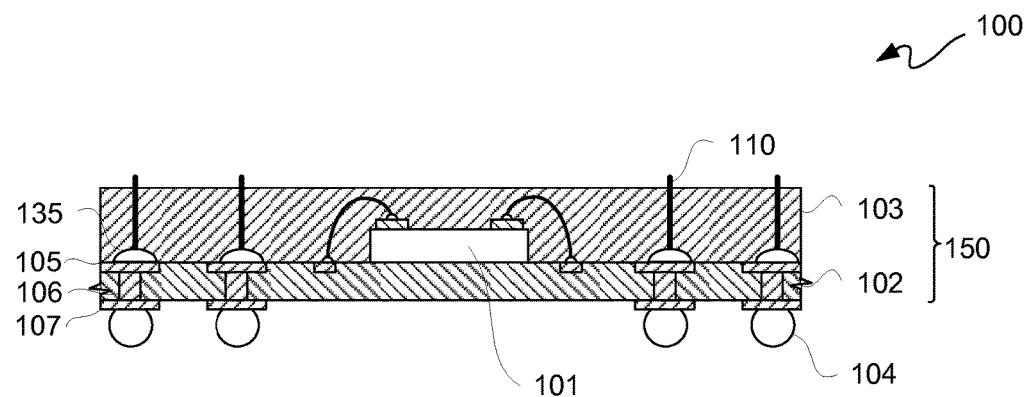
FIG. 3 is a respective block diagram of a cross-sectional side view depicting an implementation of a microelectronic device.

FIGS. 1 through 3 are respective block diagrams of cross-sectional side views depicting several implementations of a microelectronic device 100. In each implementation, a substrate 150 for a microelectronic device 100 may include an interposer or carrier 102 and a plurality of wire bond wires 110 generally extending from an upper surface 112 of such carrier 102. Wire bond wires 110 may be BVA™ wires. Such a substrate 150 for a microelectronic device 100 may further include one or more integrated circuit dies 101.

After processing, such substrate 150 may yet further include a molding material layer ("molding layer") 103. After molding, a substrate 150 may have a lower surface 111 and a generally opposite or opposing upper surface 132 of a molding layer 103, and uppermost portions of wire bond wires 110 of such substrate 150 may extend above upper surface 132.

Wire bond wires 110 may be attached to upper conductive pads 105. Upper conductive pads 105 may be in contact with upper surface 112 of carrier 102, in recesses of carrier 102 associated with upper surface 112, and/or in such recesses and extending above upper surface 112. Conductive interconnects 104, such as solder balls for example, may be attached to lower conductive pads 107. Lower conductive pads 107 may be in contact with lower surface 111 of carrier 102, in recesses of carrier 102 associated with lower surface 111, and/or in such recesses and extending below lower surface 111. Upper and lower conductive pads 105 and 107 may be coupled to one another through conductive vias 106.

Wire bond wires 110 may have a lower portion ("base") 125, a middle portion ("arm") 127, and an upper portion ("tip") 126. Bases 125 may be attached to conductive pads 105, including without limitation traces or other conductive structures associated with carrier 102. Arms 127 may extend from bases 125 to beyond an upper surface 122 of integrated circuit die 101 in molding layer 103. Tips 126 may extend from arms 127 to locations above upper surface 132 of molding layer 103. Molding layer 103 may be injected or otherwise deposited on upper surface 112 of carrier 102. Molding layer 103 may further be injected or otherwise deposited on upper surface 122 of integrated circuit die 101 for encapsulation of integrated circuit die 101.

Bond pads 108 of carrier 102 may be used for wire bonds 109 of lower ends of arched lead-over chip wires 117 to wire bonds 119 of upper ends of wires 117 to bond pads 118 of integrated circuit die 101. In this configuration, a lower surface 121 of integrated circuit die 101 may rest on an upper surface 112 of carrier 102, and bond pads 108 and 118 may respectively be located on upper surfaces 112 and 122.

In the implementation of FIG. 1, arms 127 are generally at a 90 degree angle 123 with respect to upper surface 112. However, in other implementations, such as generally indicated in FIG. 2, angle 123 may be less than or greater than 90 degrees. Furthermore, in FIG. 2, integrated circuit die 101 is illustratively depicted as being coupled to carrier 102 with microbumps 133 and associated pads 134. Optionally, molding layer 103 may not completely encapsulate integrated circuit die 101, as an upper surface 122 may be exposed. Optionally, as illustratively depicted in FIG. 3, attachment of wire bond wires 110 to carrier 102 may be reinforced with intermetallic compound ("IMC") structures, such as soldered bases 135.

For purposes of clarity and not limitation, many known details, as well as alternative and/or optional configurations, for microelectronic devices 100 have been omitted. Along those lines, various configurations, other than those specifically described, may be used in accordance with the following description.

Figure 4:
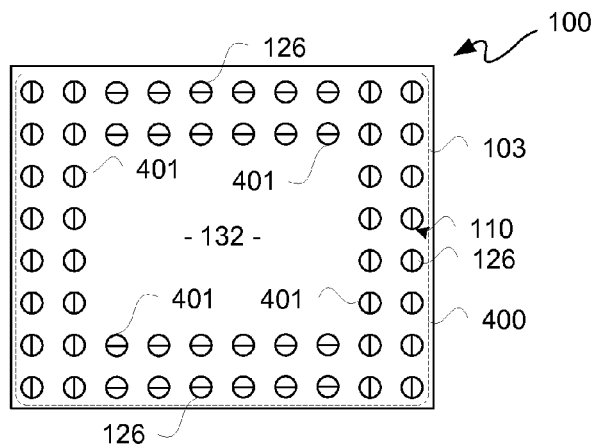
FIG. 4 is a block diagram of a top-down view of an exemplary microelectronic device.

With reference to FIG. 4, a block diagram of a top-down view of an exemplary microelectronic device 100 is illustratively depicted. In the example, there are two concentric rectangular rings of wire bond wires 110 forming an array 400. However, in other implementations, other numbers of wire bond wires 110, array shapes, array dimensions, and/or other patterns of wire bond wires 110 may be used to provide an array 400.

Tips 126 extend above upper surface 132 of molding layer 103. At an interface between tips 126 and arms 127, there may be ledge 401. Ledges 401 may, though need not be, horizontal surfaces projecting from a wall of tips 126. In FIG. 4, tips 126 have any of four orientations. However, these or other orientations of tips 126 may be used.

Figure 5:
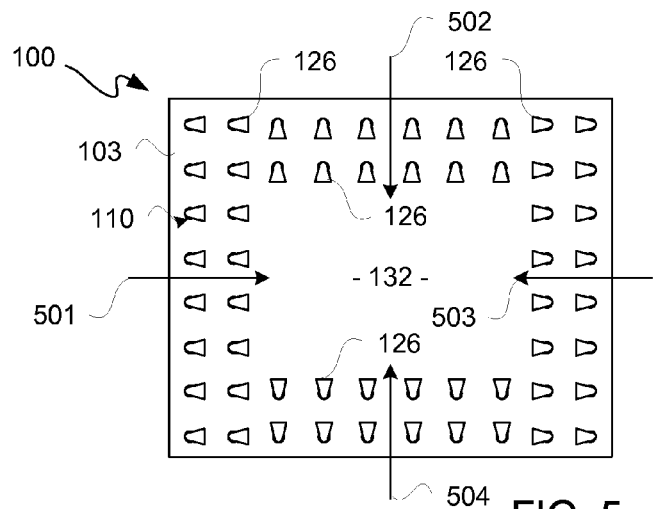
FIG. 5 is a block diagram of a top-down view of an exemplary microelectronic device after tips have been bent over.

With reference to FIG. 5, a block diagram of a top-down view of an exemplary microelectronic device 100 is illustratively depicted, after tips 126 have been bent over. Tips 126 may be bent over to have wall surfaces respectively thereof in contact with or at least proximal to corresponding ledges 401. This bending of tips 126 may be by placing substrate 150 into a molding press, as described below in additional detail. Accordingly, during pressing, tips 126 may be bent over in any of a variety of orientations to provide bent over shapes for wire bond wires 110. Even though four orientations 501 through 504 are illustratively depicted by corresponding arrows for directions tips 126 point after bending, these and/or other orientations may be used. Furthermore, even though orientations 501 through 504 point inwardly with respect to array 400, namely an open space in the center of array 400, in another implementation outwardly pointing tips 126, or a combination of inwardly and outwardly pointing tips 126, may be used.

Figure 6:
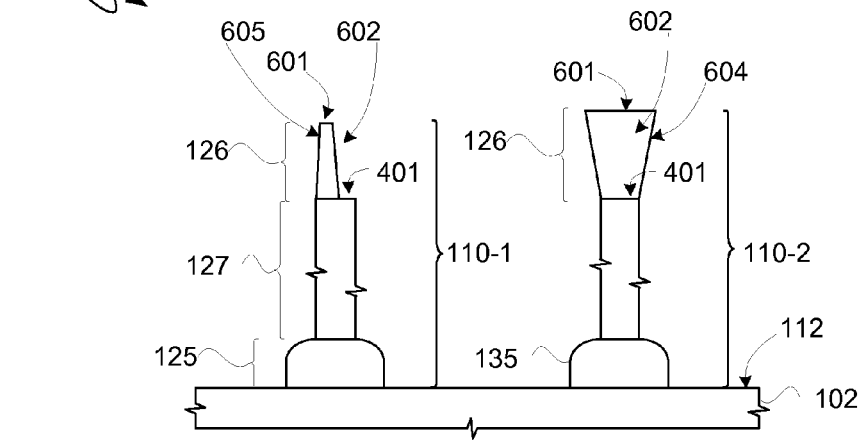
FIG. 6 is an enlarged side view depicting a pair of wire bond wires attached to an upper surface of carrier prior to formation of a molding layer.

FIG. 6 is an enlarged side view depicting a pair of wire bond wires 110-1 and 110-2 attached to an upper surface 112 of carrier 102 prior to formation of molding layer 103. Prior to formation of molding layer 103, wire bond wires 110-1 and 110-2 may be attached to pads (not shown in this FIG.) along upper surface 112 via corresponding solder bases 135.

Bases 125 of wire bond wires 110 may have j-like shapes, with bottoms thereof attached to upper surface 112 for forming wire bond wires 110. However, addition of solder bases 135 may provide additional support for enhanced reliability. Wire bond wire 110-2 may have approximately a 90 rotation with respect to orientation of wire bond wire 110-1.

Tips 126 may have a generally horizontal surface, namely ledge 401, extending away from a facing wall surface 602 extending above a corresponding ledge 401. Again, ledges 401 may, though need not be, parallel with upper surface 112. Moreover, wall surfaces 602 may, though need not be, orthogonal to corresponding ledges 401. Furthermore, a wall surface 602 may, though need not be, orthogonal to a plane of upper surface 112. In this example, front facing wall surface 602, as well as back facing wall surface 605, of a tip 126 is slightly tapered to narrow tip 126 toward a top surface 601 thereof. Right and left side surfaces 604 of a tip 126 may both be tapered to widen tip 126 toward a top surface 601 thereof. Along those lines, tip 126 may have a "shovelhead-like" or "fishtail-like" shape with a trapezoidal front facing outline being wider at a distal end than a proximal end to provide such a widened tip 126. This "fishtail-like" shape may be formed when pinching and pulling off a feed wire used to for forming wire bond wires 110. Wire bond wires 110 may be shaped in the formation thereof to provide such a "shovelhead-like" shape with a trapezoidal front facing outline. While a shovelhead-like shape may be used to provide a greater surface area for attachment to an IMC structure, other shapes may likewise be used.

A bending locus may generally be at or slightly above the intersection of ledge 401 and wall surface 602 for a tip 126, namely where a bending radius or bending moment may likely occur when tips 126 are pressed, as described below in additional detail. After pressing or bending of tips 126, such tips may have a bent over shape. Such bent over shapes provided by bent tips 126 may be used as anchors for solder or other IMC structures.

Figures 1, 7:
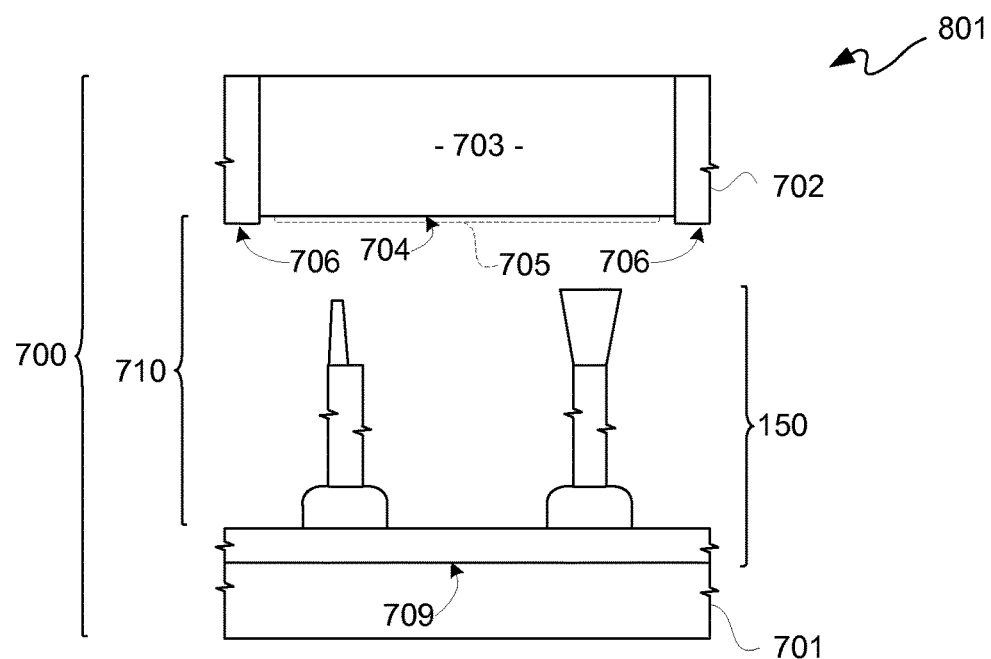
Figures 2, 7:
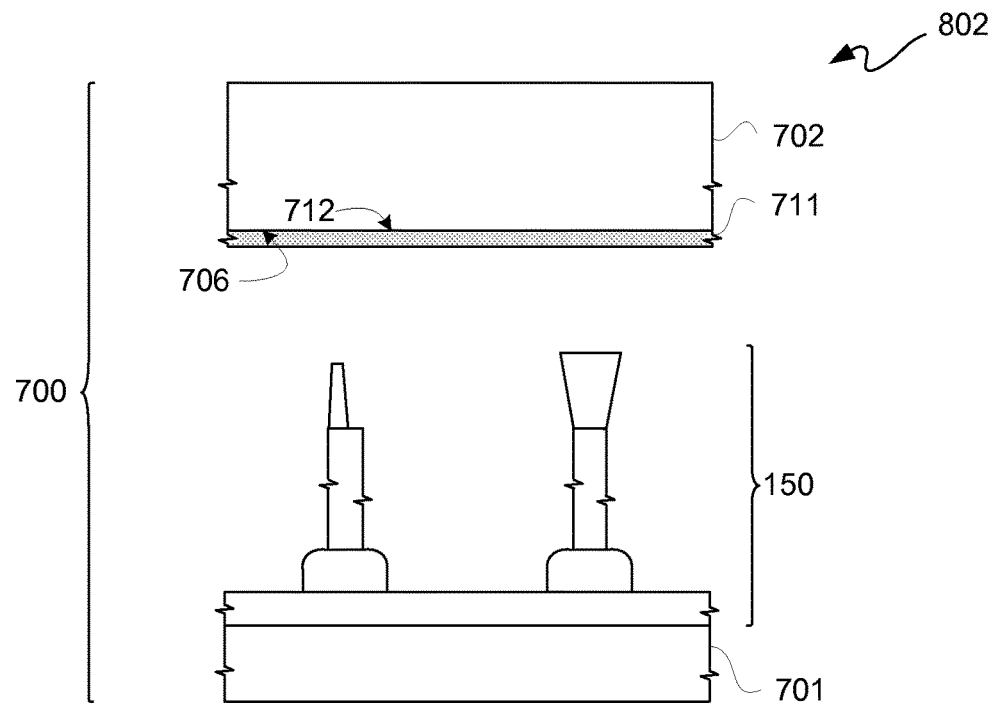
Figures 3, 7:
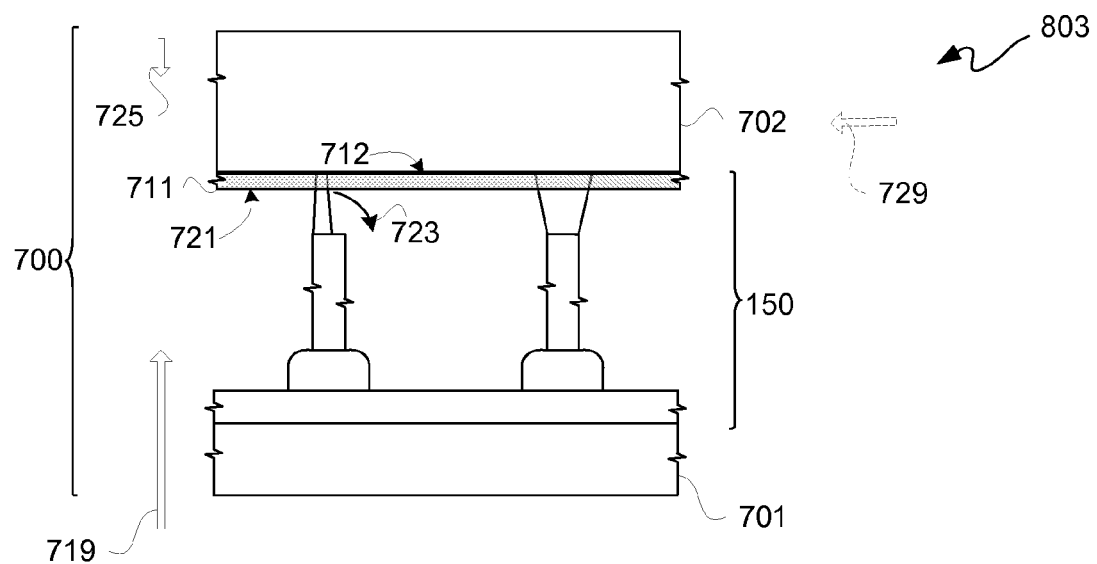
Figures 4, 7:
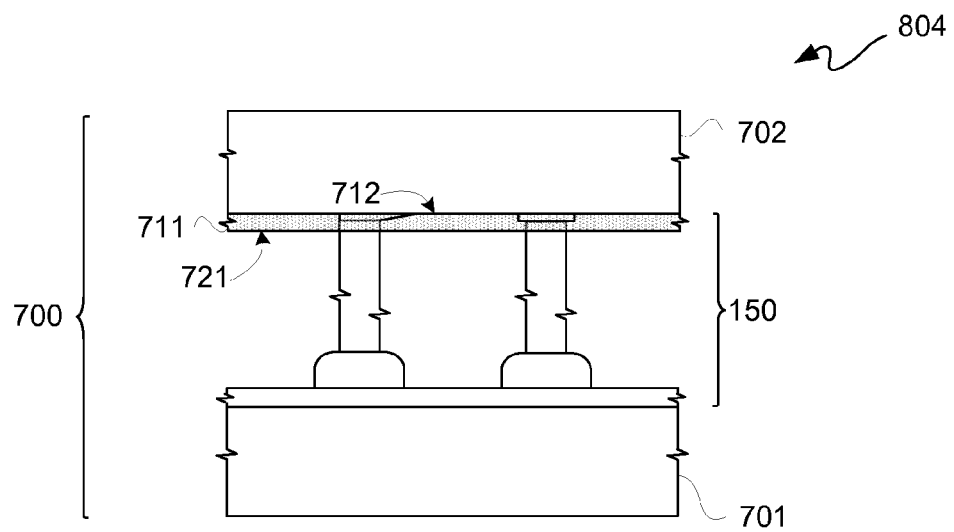
Figures 5, 7:
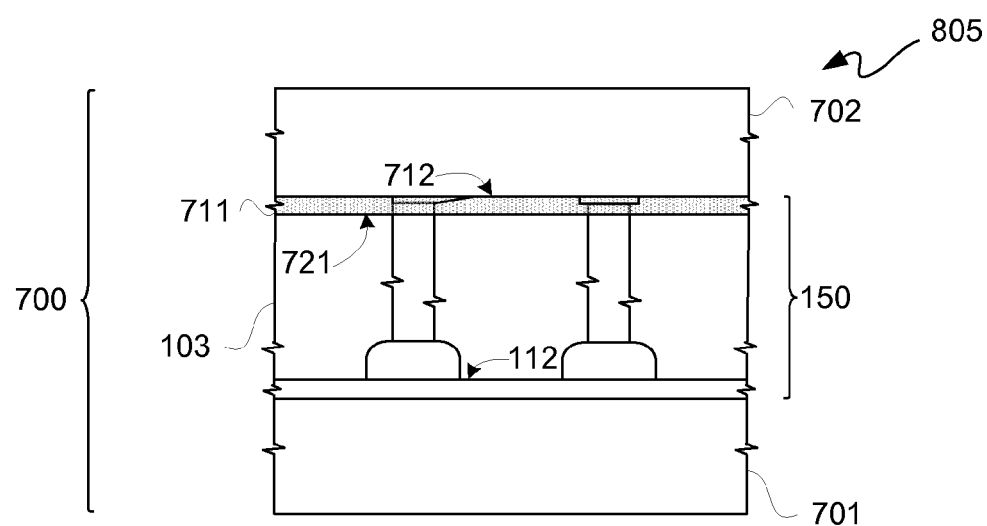
Figures 6, 7:
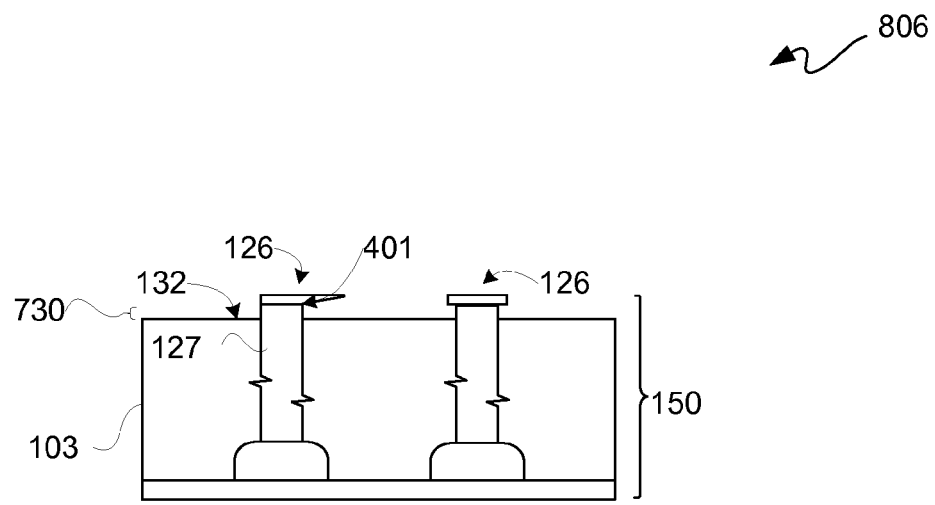

FIGS. 7-1 through 7-6 are a progression of block diagrams of a side cutaway view depicting an exemplary manufacturing process having operations 801 through 806 for forming a microelectronic device 100. FIGS. 7-1 through 7-6 are further described with simultaneous reference to FIGS. 1 through 6, where the example of FIG. 6 is used in FIGS. 7-1 through 7-6 for purposes of clarity by way of example and not limitation.

At operation 801, a substrate 150 for microelectronic device 100 may be loaded or placed into a mold press 700. In this example, mold press 700 has a bottom platen 701 and top platen 702. In this example, bottom platen 701 is movable and top platen 702 is stationary. Optionally, top platen 702 may optionally include a fixed plate 703 slightly raised or offset from lower surface 706 to define an upper interior region 705 within a cavity 710 between platens 701 and 702. Substrate 150 may be loaded into such cavity 710. However, in other implementations, no upper interior region 705 may be present, as bent over tips may be pressed into an upper surface of a deformable mold assist film, as described below in additional detail. For purposes of clarity, known details of a mold press 700 are not described herein.

After loading at 801, wire bond wires 110 of substrate 150 may extend from upper surface 112 toward an interior upper surface of mold press 700, namely a lower surface 704 of plate 703. A lower surface 111 of substrate 150 may be placed on an interior lower surface defining cavity 710, namely an interior upper surface 709 of lower platen 701 of mold press 700.

At operation 802, a mold assist film ("mold film") 711 may be indexed to a lower surface 706 of top platen 702. Along those lines, an upper surface 712 of a mold film 711 may be brought into contact or conformed to a portion of an interior upper surface, such as lower surface 706 for example, of mold press 700 without leaving a gap between another portion of such interior upper surface, such as interior upper surface 706 for example, of mold press 700 and upper surface 712 of mold film 711. Again, there is no optional gap for upper interior region 705.

At operation 803, mold film 711 may be punctured with tips 126 by moving bottom platen 701 in an upward direction 719. Along those lines, a lower surface 721 and an upper surface 712 of mold film 711 may be punctured with tips 126 of wire bond wires 110 for having tips 126 to have tips 126 bent over into upper surface 712 of mold film 711 deforming such upper surface 712 of mold film 711 into an upper interior region thereof, as generally indicated by arrow 723. In this position, substrate 150 is moved by moving lower platen 701 in an upward direction to cause tips 126 to bend toward and onto upper surface 712, as generally indicated by arrow 723. Optionally, upper platen 702 may be moved in a downward direction as generally indicated by arrow 725. Moreover, optionally both upper platen 702 and lower platen 701 may be moved in directions 719 and 725, respectively. Furthermore, optionally a lateral movement 729 of upper platen 702 may be used to assist bending of tips 126 to reduce likelihood of cracking of wire bond wires 110 due to application of a compressive force. For uses of a lateral movement 729, tips 126 may all have a same orientation.

At operation 804, tips 126 may continue to be pressed in a generally downward direction to provide shaped bent over tips 126 for wire bond wires 110. In this example, bent over tips 126 may be flattened between lower surface 706 of platen 702 and into a deformable upper surface 712 of mold film 711. This pressing of tips 126 may optionally include flattening or coining of tips 126.

Furthermore, in this example, upper surface 712 of mold film 711 may be coplanar with ledges 401. However, in other examples, ledges 401 may extend to or just above upper surface 712, and thus tips 126 may be bent down for stopping on ledges 401 instead of being bent into upper surface 712.

At operation 805, a molding material may be injected between upper surface 112 of substrate 150 and lower surface 721 of mold film 711 for molding layer 103. At operation 806, such molding material may be cured to form molding layer 103, and mold film 711 may be used to assist release of substrate 150 with such molding layer 103 from mold press 700.

After formation and release of substrate 150 from mold press 700, including removal of mold film 711 from substrate 150, there may be a gap 730 between upper surface 132 of molding layer 103 and ledges 401, and this gap 730 may be associated with a partial thickness of mold film 711, namely a lower portion of a distance between surfaces 712 and 721 of mold film 711. Moreover, bent over tips 126 and uppermost portions of arms 127 corresponding to gap 730 may extend above upper surface 132. Thus, lower surfaces of shaped bent over tips 126 may be spaced-away from upper surface 132 of molding layer 103.

In the above example, tips 126 were bent prior to forming a molding layer 103. However, in another implementation, tips 126 may be bent after forming a molding layer 103.

In either order, tips 126 may be pressed down against an upper surface 712 of mold film 711, and such tips 126 may thus be bent over leaving a space between bottom surfaces of such tips 126 and upper surface 132 of molding layer 103 after removal of mold film 711. Again, tips 126 may be shaped prior to loading into mold press 700, and such shaped tips 126 may be to provide bending locations for bending. The above process may generally be thought of as a pressing of tips prior to molding, namely a pressing-before-molding process. The following description may generally be thought of as a pressing-after-molding process.

Figures 1, 8:
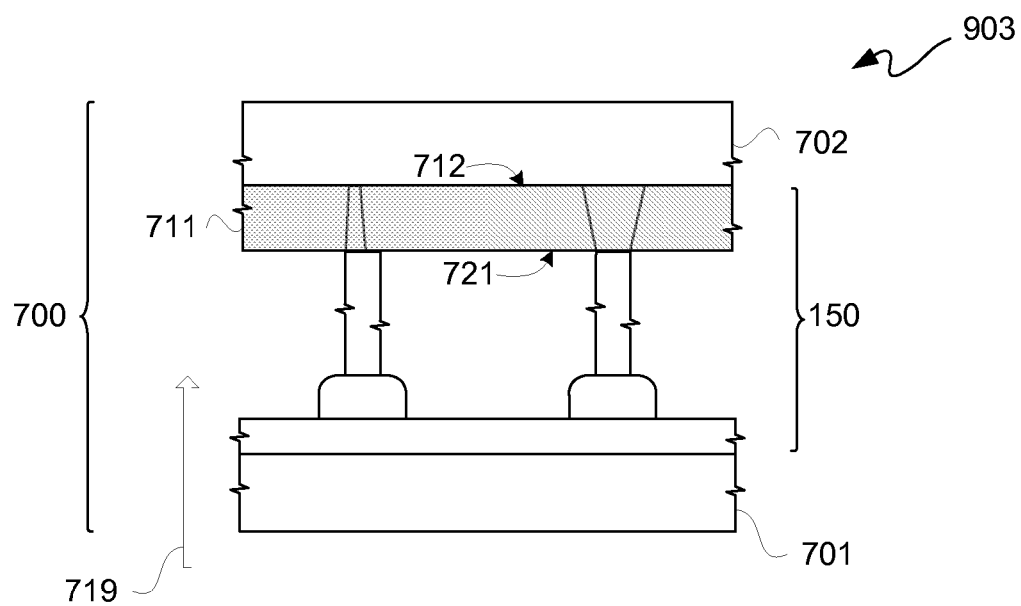
Figures 2, 8:
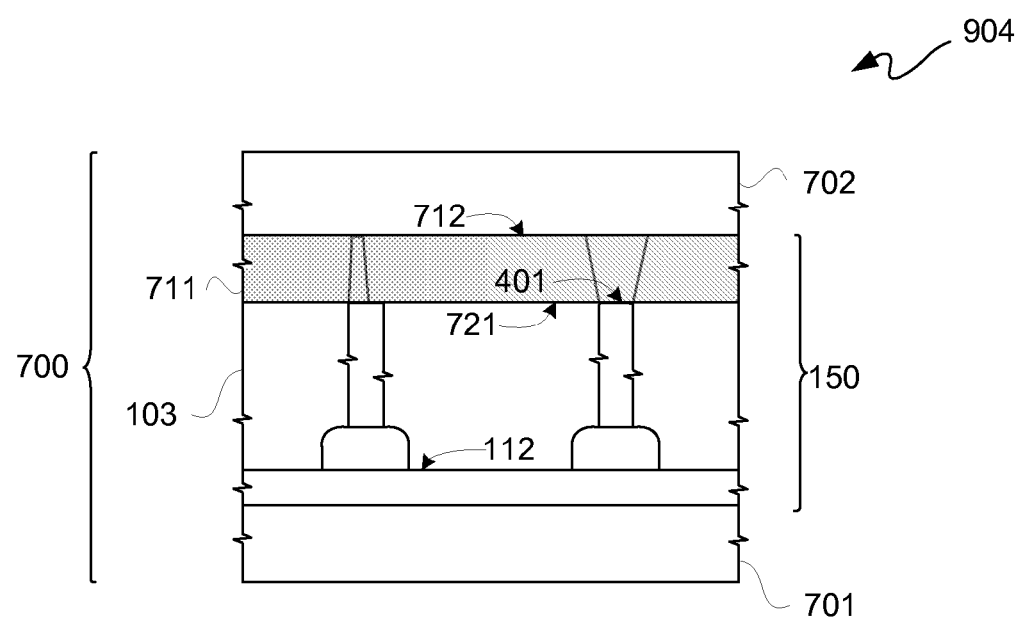
Figures 3, 8:
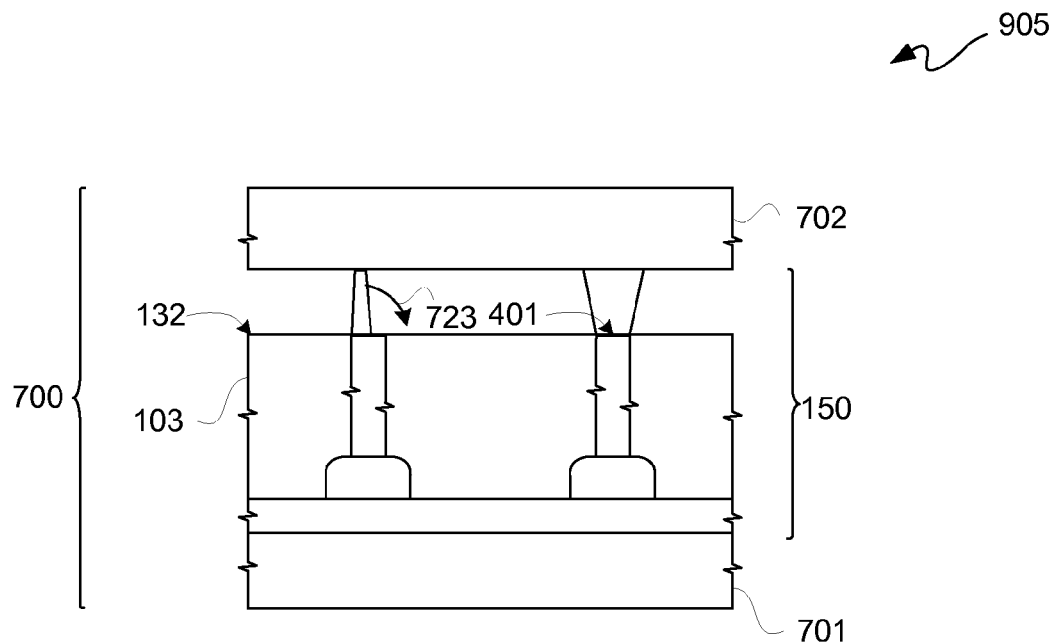
Figures 4, 8:
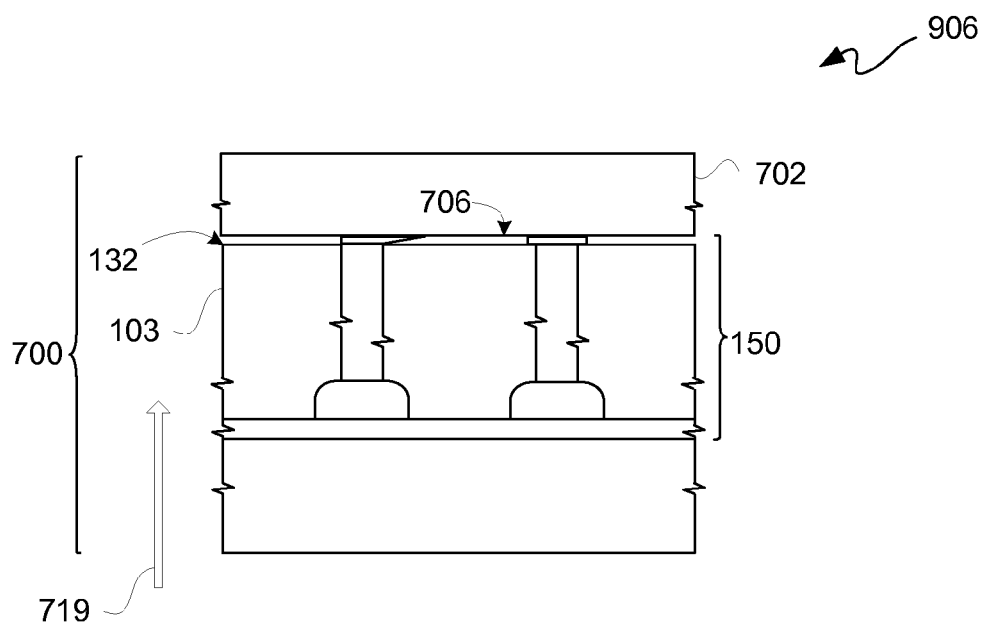

FIGS. 8-1 through 8-4 are a progression of block diagrams of a side cutaway view depicting an exemplary manufacturing process having operations 903 through 906 for forming a microelectronic device 100. FIGS. 8-1 through 8-4 are further described with simultaneous reference to FIGS. 1 through 7-6, where the example of FIG. 6 is used in FIGS. 8-1 through 8-4 for purposes of clarity by way of example and not limitation.

Prior to operation 903, operations 801 and 802 may be performed as previously described. However, in operation 802 a thicker mold film 711 is indexed to a lower surface of upper platen 702. In the above example of a thinner mold film 711, such mold film thickness may be in a range of approximately 10 to 50 microns, and in the example of a thicker mold film 711, such mold film thickness may be in a range of approximately 50 to 150 microns. In other implementations, these or other ranges may be used. For example, for anchors using bent over tips 126, longer tips may be used and correspondingly thicker molding film to provide more surface area for anchoring at the expense of a larger pitch. Bent over tips 126 may be used as anchors for soldering for example.

At operation 903, this thicker mold film 711 may be punctured with tips 126 by moving either or both lower platen 701 and upper platen 702, as previously described. In this example, lower platen 701 is moved in an upward direction 719. Along those lines, a lower surface 721 and an upper surface 712 of mold film 711 may be punctured with tips 126 of wire bond wires 110 for having at least a substantial portion, if not all, of tips 126 extend above lower surface 721 of mold film 711 into an interior region of mold film 711, namely having such substantial portion of such tips 126 located in mold film 711 between upper surface 712 and lower surface 721 of such mold film 711 prior to molding. Optionally, uppermost portions of arms 127 may likewise extend into mold film 711 prior to molding. In this example, lower surface 721 is generally co-planar with ledges 401; however, ledges 401 may be above, equal with, and/or below lower surface 721 in this or other implementations.

At operation 904, a molding material may be injected between upper surface 112 of substrate 150 and lower surface 721 of mold film 711 for molding layer 103. At operation 905, such molding material may be cured to form molding layer 103, and mold film 711 may be used to assist release of substrate 150 from such molding layer 103 and then such mold film 711 may be removed from mold press 700.

After formation of molding layer 103 and removal of mold film 711 from substrate 150 at operation 905, upper surface 132 of molding layer 103 and ledges 401 may optionally be co-planar, as in this example. However, as previously indicated, such ledges 401 may be above or below upper surface 132. At 906, substrate 150 may be moved by having lower platen 701 moved in an upward direction 719 to cause tips 126 to be pressed into lower surface 706 of upper platen 702 to bend such tips 126 toward upper surface 132, as generally indicated by arrow 723 in FIG. 8-3.

At operation 906, tips 126 may be pressed down against an upper surface 132 of molding layer 103, and such tips 126 may thus be bent over. After bending, tips 126 may optionally be against upper surface 132 of molding layer 103, which optionally may leave no readily perceivable gap between bottom surfaces of such tips 126 and upper surface 132 of molding layer 103. Again, tips 126 may be shaped prior to loading into mold press 700, and such shaped tips 126 may be to provide bending locations.

Pressing of such tips 126 may optionally flatten such tips between upper surface 132 of molding layer 103 and lower surface 706 of upper platen 702. Again, though lower platen 701 may be raised for this pressing, either or both platens may be moved for pressing, as described elsewhere herein, to provide bent over tips 126. Such pressing may further flatten tips, which may spread out such tips 126. After such pressing operation at 906, substrate 150 may be removed from mold press 700. By pressing after molding, arms 127 may have some protection from compressive stresses by molding layer 103.

Figure 9:
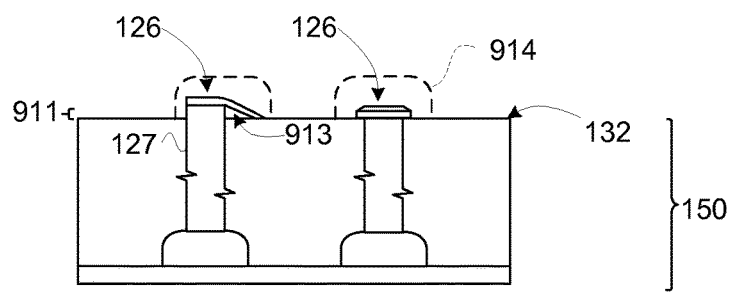
FIG. 9 is a block diagram of a side cutaway view depicting another exemplary substrate after a manufacturing process having operations for forming a microelectronic device but with an uppermost portion of an arm of wire bond wires embedded in a mold film.

As previously described an uppermost portion of an arm 127 may be embedded in mold film 711. Along those lines, FIG. 9 is a block diagram of a side cutaway view depicting another exemplary substrate 150 after a manufacturing process having operations for forming a microelectronic device as described above but with an uppermost portion 911 of an arm 127 of wire bond wires 110 embedded in mold film 711. Such uppermost portions 911 of arms 127 of wire bond wires 110 may be adjacent and integral with lowermost portions of such tips 126. Along those lines, a pressing after molding may be used to bend tips 126 over to have an uppermost portion of such tips bent down to be at least proximate to or touching upper surface 132. Such bent over tips 126 may define an underside through region or air gap 913, such as for a hook-like structure or shape for example. Optionally, a solder ball 914 may be placed over tips 126, and such bent over tips 126 may be used to anchor such solder balls 914, namely solder anchors which may include completely or partially filing such air gaps 913 with solder to assist in anchoring.

Figures 1, 10:
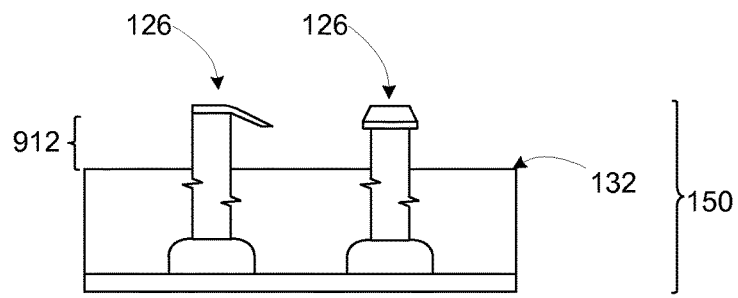
Figures 2, 10:
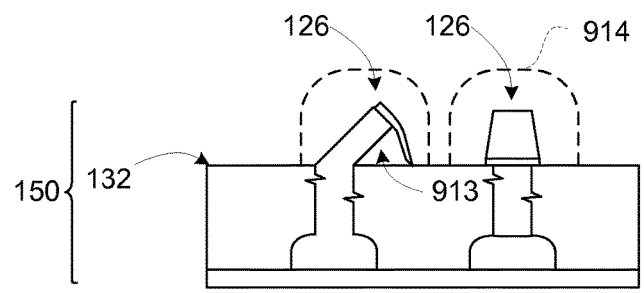

As previously described an uppermost portion of an arm 127 may be embedded in mold film 711. Along those lines, FIGS. 10-1 and 10-2 are block diagrams of a side cutaway view depicting yet another exemplary substrate 150 after another manufacturing process having operations for forming a microelectronic device as described above but with an upper portion 912, longer than an uppermost portion 911, of an arm 127 of wire bond wires 110 embedded in mold film 711. Such upper portions 912 of arms 127 of wire bond wires 110 may include such uppermost portions 911 and thus may be adjacent and integral with lowermost portions of such tips 126. Along those lines, a pressing after molding may be used to bend tips 126 over to have an uppermost portion of such tips bent down to be at least proximate to or touching upper surface 132. Such bent over tips 126 may define an underside through region 913, such as for a hook-like structure or shape for example. Optionally, a solder ball 914 may be placed over tips 126, and such bent over tips 126 may be used to anchor such solder balls 914, including completely or partially filing such air gaps 913 to assist in anchoring.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for forming a microelectronic device, comprising:
    loading a substrate for the microelectronic device into a mold press;
    the substrate having a first surface and a second surface;
    the second surface being placed on an interior lower surface of the mold press;
    the substrate having a plurality of wire bond wires extending from the first surface toward an interior upper surface of the mold press;
    indexing an upper surface of a mold film to the interior upper surface of the mold press;
    puncturing a lower surface of the mold film with tips of the plurality of wire bond wires for having the tips of the plurality of wire bond wires extending above the lower surface of the mold film into the mold film;
    puncturing an upper surface of the mold film with one or more of the tips of the plurality of wire bond wires;
    pressing the tips of the plurality of wire bond wires down toward the lower surface of the mold film to bend the tips over; and bending the tips over responsive to the pressing for having bent over shapes for the tips.

2. The method according to claim 1, wherein the pressing further comprises pressing the tips into the upper surface of the mold film for deforming the upper surface of the mold film.

3. The method according to claim 2, further comprising:
injecting a molding material between the first surface of the substrate and the lower surface of the mold film; and
curing the molding material.

4. The method according to claim 3, further comprising:
releasing the substrate from the mold press including removal of the mold film from the substrate;
wherein the tips are bent over responsive to the bending leaving a space between bottom surfaces of the tips and a top surface of the molding material.

5. The method according to claim 4, wherein the tips are flattened between the upper surface of the mold film and the upper interior surface of the mold press.

6. The method according to claim 4, wherein the tips have trapezoidal front facing outlines prior to the pressing.

7. The method according to claim 4, wherein the tips have shapes to provide locations for the bending.

8. The method according to claim 4, wherein the tips are bent over to provide solder anchors after the pressing.

9. The method according to claim 1, wherein the pressing comprises lowering the upper interior surface of the mold press for the pressing of the tips down against the upper surface of the mold film.

\* \* \* \* \*